United States Patent
Worm et al.

(10) Patent No.: US 7,116,732 B2
(45) Date of Patent: Oct. 3, 2006

(54) METHOD AND APPARATUS FOR DECODING A BIT SEQUENCE

(75) Inventors: Alexander Worm, Brussels (BE); Heiko Michel, Kaiserslautern (DE); Norbert Wehn, Queidersbach (DE)

(73) Assignee: Alcatel, Paris (FR)

( * ) Notice: Subject to any disclaimer, the term of this patent is extended or adjusted under 35 U.S.C. 154(b) by 761 days.

(21) Appl. No.: 10/176,127

(22) Filed: Jun. 21, 2002

(65) Prior Publication Data

US 2003/0002603 A1    Jan. 2, 2003

(30) Foreign Application Priority Data

Jun. 21, 2001    (EP) ................... 01404649

(51) Int. Cl.
*H03D 1/00*    (2006.01)
(52) U.S. Cl. ....................................... 375/341
(58) Field of Classification Search ................ 375/130, 375/316, 377, 259, 260, 261, 262, 341, 340; 714/796, 795, 792, 786, 746, 699
See application file for complete search history.

(56) References Cited

U.S. PATENT DOCUMENTS

| | | | |
|---|---|---|---|
| 4,802,174 A | | 1/1989 | Hiraiwa et al. |
| 5,331,664 A | | 7/1994 | Desperben et al. |
| 5,442,627 A | | 8/1995 | Viterbi et al. |
| 6,343,103 B1 * | | 1/2002 | Lou et al. .............. 375/261 |
| 6,452,984 B1 * | | 9/2002 | Banister et al. ......... 375/341 |

FOREIGN PATENT DOCUMENTS

| | | |
|---|---|---|
| EP | 0409205 A2 | 1/1991 |
| WO | WO 0027085 | 5/2000 |
| WO | WO 0038366 | 6/2000 |

OTHER PUBLICATIONS

Vogt et al, "Comparison of different turbo decoder realizations for IMT-2000", Seamless Interconnection For Universal Services, Global Telecommunication Conference, Globecom '99, vol. 5, Dec. 5-9, 1999, pp. 2704-2708 XP010373441.
G. D. Forney, "The Viterbi Algorithm" Proceedings of the IEEE, NY, US. vol. 61, No. 3—Mar. 1, 1973, pp. 268-278 XP000573242.

(Continued)

*Primary Examiner*—Pankaj Kumar
(74) *Attorney, Agent, or Firm*—Sughrue Mion, PLLC

(57) ABSTRACT

A method and apparatus are disclosed for decoding according to a Log-MAP algorithm, a bit sequence encoded by a convolutional encoder and received through a noisy channel. A digital signal processor (DSP) for performing the decoding is provided with an extended core possessing a transition metric calculation unit (153) for calculating transition metric values of the encoder trellis for output to a memory store (101,102) of the DSP, and for output to a unit (154) for performing a Log-MAP add-compare-select operation. The Log-MAP add-compare-select unit (154) calculates updated path metric values of the encoder trellis for storage in a memory store (101,102) of the DSP, and for input to a Log-Likelihood Ratio calculating unit (155). The Log-Likelihood Ratio calculating unit (155) are each controlled by the program control unit (104) of the DSP, and communicate with the data memories (101, 102) of the DSP, via data lines (150, 151, 152).

45 Claims, 9 Drawing Sheets

OTHER PUBLICATIONS

P. Robertson et al, "A Comparison of Optimal and Sub-Optimal Map Decoding Alogrithms Operating in the Log Domain" Communications—Gateway to Globalization. Proceedings of the Conference on Communications, Seattle, Jun. 18-22, 1995, Proceedings of the Conference on Communications (ICC), NY, IEEE, vol. 2, Jun. 18, 1995, pp. 1009-1013, XP000533149.

* cited by examiner

METHOD AND APPARATUS FOR DECODING A BIT SEQUENCE

The present invention relates to a method and apparatus for decoding, according to a Log-MAP algorithm, a bit sequence encoded by a convolutional encoder and received through a noisy channel.

A key demand on any communications system is to ensure that the information received by the system corresponds closely (exactly if possible) with the information originally transmitted to the system. Transmission errors, such as bit errors, are often unavoidably introduced into a communications system by noisy transmission channels etc. and, as a result of this, much effort has been expended on developing forward-error-correction (FEC) schemes. These schemes aim to correct errors in received signals by using information contained within the signal itself.

FEC schemes generally aim to be sufficiently sophisticated to provide acceptably low bit error rates in error-corrected data, yet not be too complex or costly (in terms of reduced data-transmission rates) to implement in practice. A widely used FEC coding scheme is that of "Turbo-Coding" which is regarded by some commentators in the field of data coding as being the most powerful FEC coding scheme presently available.

Turbo-Codes developed from the concepts of "concatenated coding" and "iterative decoding", and the term "Turbo-Codes" better describes the iterative decoding step rather than the concatenated encoding step. Typically, the encoding step of Turbo-Codes involves the parallel concatenation of two convolutional codes, although serial (or hybrid) concatenation is also possible. In this arrangement, two convolutional encoders are arranged in parallel, both having the same data sequence as input, but with one of the two encoders operating upon that data only after it has been interleaved. The output of these encoders may then be combined with the original (un-coded) data sequence for transmission, thereby providing a "systematic" code sequence in which the data symbols from the input data sequence appear unchanged in the resulting output code sequence.

Thus, the output code sequence comprises the original un-coded data and associated check-bits which can be used by a decoder to correct errors in the received code sequence. By concatenating the encoders in this way, a relatively complex code can be produced using relatively simple constituent encoders.

Convolutional encoding is a well established encoding technique in which input data sequences are split into "blocks" of a predetermined length, each of which are independently encoded to produce a "code block" of check bits for the input data. In particular, convolutional encoding is performed by calculating the modulo-2 sum of a current input data-bit and one or more preceding input data-bits.

Implementation of this encoding method may be by way of shift-registers and exclusive-OR gates as illustrated by the example Recursive Systematic Convolutional (RSC) encoder of FIG. 1. When the encoder receives an input bit at input 1, the bit passes directly to the "systematic" output 2 and to the first of the three shift-registers 3 via one of the four exclusive-OR gates 4, thereby causing a corresponding code bit (i.e. a check-bit) to be output at output 5 simultaneously with the systematic bit at output 2. It will be noted that the output of the second and third shift-registers is also input (via exclusive-OR gates) to the first register via a "recursive" feed-back loop 6. In this example, the provision of three shift-registers 3 provides a convolutional encoder with "constraint length" K=4, meaning that the encoder output (check-bit) at a given time depends upon four encoder inputs, namely the present input and the three preceding ones (i.e. those stored in the three shift-registers 3).

The behaviour of an encoder is conveniently represented by a "code-trellis" as illustrated in FIG. 2, which corresponds to the RSC encoder of FIG. 1. Each column in the code-trellis corresponds to the input into the encoder of a new data block (in this case one bit) at the $k^{th}$ time-step, and the $2^{K-1}=8$ (K=4) nodes of the trellis correspond to the possible states of the encoder at each such-time step (i.e. the contents of the K shift-registers 3). The branches 20 joining adjacent nodes 21 represent possible ways in which the state of the encoder can change between time-steps k–1 and k, as a result of the input thereto of a data "one" bit (solid lines) or a data "zero" bit (dashed lines). Accordingly, each node 21, at a given time-step k–1, is the source of two branches each branch joining that node to a respective one of two possible succeeding adjacent nodes at time-step k. Similarly, each node after the fourth time-step is also the terminus of two branches, each branch joining that node to a respective one of two possible preceding adjacent nodes.

In this way a trellis of all possible transitions of the encoder is provided. The possible transitions depend upon the nature of the code (RSC code in this case), and any one path through the trellis represents one possible input data sequence and its corresponding output code sequence. It is this property which is used in decoding a given code sequence output by an encoder, when received at a decoder.

The Viterbi algorithm is often employed to decode convolutional codes. Its objective is to find the path through the code-trellis that most closely resembles the received code sequence, processing one code block (i.e. time-step) at a time. The principle of the algorithm is to progressively build the most likely complete path by determining at each node (at a given time-step) the path to that node which corresponds with the code sequence which is closest to the received code sequence. Each such "survivor" path determined in this way is then extended by repeating the step for successive adjacent nodes in the trellis until the path can be extended no further. The best of the remaining "survivor" paths is then chosen as being the one most likely to represent the actual state transitions that the encoder made when encoding the data. Accordingly, an estimate of the data sequence input to the encoder can be obtained with knowledge of the encoder properties.

Each branch of the trellis carries with it a "branch metric" representing the probability of the encoder having made the transition represented by that branch, given the received code sequence and channel side information and the encoder properties. Each survivor path also carries with it a "path metric" derived from the metrics of the constituent branches of that path. Thus, when each survivor path is extended from a given node by one branch, there is an associated branch metric calculation for each possible branch from that node, followed by an addition of each branch metric to the path metric of that node, followed by a comparison of the two resulting path metrics and then a final selection of which of the two is to be the survivor path. This add-compare-select ("ACS") process must be repeated many times throughout the trellis when decoding a code sequence, and results in a very large number of operations having to be performed and extensive data storage requirements. Consequently, a number of "acceleration" schemes have been proposed in the art which aim to perform more efficiently the ACS process in a Viterbi decoding algorithm.

An alternative decoding algorithm is the Logarithmic Maximum A Posteriori (Log-MAP) decoding algorithm. This decoding algorithm performs ACS operations, similar to those of the Viterbi algorithm, for each time-step in the trellis. In doing so the Log-MAP algorithm determines the most likely information bit to have been transmitted given a received code sequence which may be noisy or distorted. This is unlike the Viterbi decoding algorithm which determines the most likely transmitted code sequence (i.e. via the survivor path).

In general, a MAP decoder must ultimately select the most likely transmitted code sequence $\vec{x}$, given a received sequence $\vec{y}$, in a manner equivalent to maximizing the conditional probability:

$$p(\vec{x}|\vec{y}) = \frac{p(\vec{y}|\vec{x})p(\vec{x})}{p(\vec{y})}.$$

This is the "maximum a posteriori" (MAP) criterion. The quantities $p(\vec{y})$ and $p(\vec{x})$ are assumed constant, hence the MAP criterion amounts to maximizing $p(\vec{y}|\vec{x})$.

In "hard decision" coding, the MAP criterion is satisfied using only the received sequence $\vec{y}$, unchanged. In "soft decision" coding, information regarding the reliability or "likelihood" of the bit values in $\vec{y}$ is generated also.

The Log-MAP algorithm quantifies this soft information in terms of "Log-Likelihood Ratios" (LLR) to represent, in the log domain, the degree of certainty of specific decoded bits at the output of a decoder and is used in iterative decoding of Turbo-codes.

The Log-MAP algorithm operates in the logarithmic domain in order to compress the large range of numerical values encountered and also to turn multiplication into simple additions etc. Thus, the Log-MAP algorithm utilises more of the information available during decoding so as to increase decoding efficiency since unreliable bit decisions can be corrected if required. More importantly, the Log-MAP decoding algorithm inherently provides "soft" decision information which can be effectively used in decoding concatenated codes.

Although the Viterbi decoding algorithm may be adapted to provide soft information for this purpose, such information is widely regarded as being inferior to that provided by the Log-MAP decoding algorithm. This limitation is especially important when employing Turbo-Codes which rely on an iterative decoding scheme which employs soft information. Hence, the higher quality of soft information provided by the Log-MAP decoding algorithm renders it well suited to applications involving Turbo-Codes.

Consequently, it is generally desirable to increase the efficiency of the Log-MAP algorithm in its application to Turbo-Coding. However, in contrast to the Viterbi algorithm, current digital signal processors do not provide any specific acceleration schemes for the Log-MAP algorithm.

Thus, it is an aim of the present invention to overcome this general deficiency in the prior art at least by exploiting the structure of the trellis associated with a Log-MAP encoder. In particular, in the trellis of a binary convolutional encoder, the transitions between neighbouring states can be segregated into disjoint groups of four each originating in a concurrent pair of states and terminating in another concurrent pair. The structure produced by these four states is known as a trellis "butterfly".

At its most general, the present invention proposes to accelerate the operation of a Log-MAP decoding algorithm by at least performing each step of an Add-Compare-Select (ACS) operation in respect of one state of one concurrent pair of states of a trellis butterfly in parallel with each corresponding step of an Add-Compare-Select operation in respect of the other state of the one concurrent pair of states. The ACS operation may form part of a path metric update or part of a Log-Likelihood Ratio calculation.

In parallel processing in this way, each one of the two ACS operations performed on the two concurrent states of a pair of butterfly states utilize the same data quantities, namely the same set of path metric values and the same two possible transition metric values between the two concurrent pairs of states of the butterfly. Thus, according to the present invention, the operation of the Log-MAP decoding algorithm may be accelerated at least through approximately halving the data retrieval requirements of the operation.

Accordingly, in a first aspect of the present invention there may be provided a method for calculating path metric values of a convolutional encoder for use in decoding according to a Log-MAP algorithm a bit sequence encoded thereby and received through a noisy channel, the method comprising the steps of:

(i) adding to the path metric value associated with a first encoder state a first transition metric value associated with the transition of said encoder from said first encoder state to a first adjacent encoder state thereby providing a first path metric value for said first adjacent encoder state;

(ii) substantially simultaneously with step (i) adding to the path metric value associated with a second encoder state concurrent with said first state a second transition metric value associated with the transition of said encoder from said second encoder state to said first adjacent encoder state thereby providing a second path metric value for said first adjacent encoder state;

(iii) comparing said first path metric value for said first adjacent encoder state to said second path metric value therefor and selecting the maximum of the two to be the path metric value associated with that adjacent encoder state;

(iv) adding to the path metric value associated with said first encoder state said second transition metric value associated with the transition of said encoder from said first encoder state to a second adjacent encoder state concurrent with said first adjacent encoder state thereby providing a first path metric value for said second adjacent encoder state;

(v) substantially simultaneously with step (iv) adding to the path metric value associated with said second encoder state said second transition metric value associated with the transition of said encoder from said second encoder state to said second adjacent encoder state thereby providing a second path metric value for said second adjacent encoder state;

(vi) comparing said first path metric values for said second adjacent encoder state to said second path metric value therefore and selecting the maximum of the two to be the path metric value associated with that adjacent encoder state;

wherein said encoder states and said adjacent encoder states define a trellis butterfly and the sequence of steps (i), (ii) and (iii) are performed substantially simultaneously with the sequence of steps (iv), (v) and (vi) respectively.

Preferably, the method includes the step of adding the correction term $$\ln(1+\exp(-\Delta))$$

to the selected path metric value associated with a given adjacent encoder state, where $\Delta$ is the absolute value of the difference between said first path metric value of said given adjacent encoder state and said second path metric value thereof.

Thus, an accelerated Log-MAP Add-Compare-Select operation (LM_ACS) is provided. The LM_ACS operation requires two path metric values and two branch metric values to process a trellis butterfly. The result of the operation is the simultaneous production of two updated path matrices. The use of the correction term may improve the accuracy of the path metric values obtained according to the LM_ACS operation. This correction factor, when added to the selected maximum value of the two quantities defining $\Delta$, results in the Jacobian logarithm of these two quantities, of which the selected maximum value is only an approximation (i.e. $\ln(e^a+e^b)=\max(a,b)+\ln(1+e^{-\Delta}), \Delta=|a-b|$).

The above steps (i) to (vi) may be repeated for all other concurrent trellis butterflies. Thus, each complete path metric update at a given trellis time-step may be mapped onto an m-fold execution of the LM_ACS operation for a trellis having m butterflies per time-step.

The path metric values for all of said encoder states and said adjacent encoder states may be forward path metrics calculated by forward recursion wherein all of said adjacent encoder states succeed all of said encoder states. Alternatively, the path metric values for all of said encoder states and said adjacent encoder states may be backward path metrics calculated by backward recursion wherein all of said adjacent encoder states precede all of said encoder states.

Therefore, both forward and backward path metric updating may be performed using the LM_ACS operation. This is particularly advantageous in calculating Log-Likelihood Ratios (LLR) which require both.

According to a second aspect of the present invention, there may be provided a method for calculating Log-Likelihood Ratio values for state transitions of a convolutional encoder for use in decoding according to a Log-MAP algorithm a bit sequence encoded thereby and received through a noisy channel, the method comprising the steps (i) to (iii) which are performed in respect of only those transitions corresponding with a parity bit of a first value, and steps (iv) to (vi) which are performed in respect of only those transitions corresponding with a parity bit of a second value:

(i) adding to the forward path metric value associated with a first encoder state of a given trellis butterfly; a first transition metric value associated with the forward transition of said encoder from said first encoder state to a first adjacent encoder state of said butterfly; and, the backward path metric value associated with said first adjacent encoder state to provide a first sum;

(ii) substantially simultaneously with step (i) adding to the forward path metric value associated with a second encoder state of said trellis butterfly concurrent with said first state; said first transition metric value associated with the forward transition of said encoder from said second encoder state to a second adjacent encoder state of said butterfly concurrent with said first adjacent encoder state; and, the backward path metric value associated with said second adjacent encoder state to provide a second sum;

(iii) comparing said first sum and said second sum and selecting the maximum value of the two to be a first maximum value;

(iv) adding to the forward path metric value associated with said second encoder state; a second transition metric value associated with the forward transition of said encoder from said second encoder state to said first adjacent encoder state; and, the backward path metric value associated with said first adjacent encoder state to provide a third sum;

(v) substantially simultaneously with step (iv) adding to the forward path metric value associated with said first encoder state; said second transition metric value associated with the forward transition of said encoder from said first encoder state to said second adjacent encoder state; and, the backward path metric value associated with said second adjacent encoder state to provide a fourth sum;

(vi) comparing said third sum and said fourth sum and selecting the maximum value of the two to be a second maximum value;

whereby the sequence of steps (i), (ii) and (iii) is performed substantially simultaneously with the sequence of steps (iv), (v) and (vi) respectively and steps (i) to (vi) are repeated for the encoder states of all other concurrent trellis butterflies to provide a set of first maximum values and a set of second maximum values, and the maximum element of said set of second maximum values is subtracted from the maximum element of said set of first maximum values to provide a Log-Likelihood Ratio.

Thus, it will be appreciated that steps (i) to (vi) of this second aspect of the present invention employ an extension of the LM_ACS operation according to the first aspect of the invention. In particular, the "Add" component of the LM_ACS operation is here extended from being the addition of two quantities (e.g. path metric+transition metric to the same one state) to the addition of three quantities (i.e. forward path metric+transition metric to different states+backward path metric). Accordingly, this extended LM_ACS operation requires two forward path metric values, two transition metric values and two backward path metric values to process a trellis butterfly.

In accordance with the second of its aspects, the invention preferably may provide a method for calculating LLR values wherein the maximum element of said set of second maximum values is subtracted from the maximum element of said set of first maximum values according to the steps of:

(i) choosing two elements from said set of first maximum values, comparing said two elements and selecting the maximum value of the two to be an element in a successive set of first maximum values;

(ii) substantially simultaneously with step (i) choosing two elements from said set of second maximum values, comparing said two elements and selecting the maximum value of the two to be an element in a successive set of second maximum values;

(iii) repeating steps (i) and (ii) in respect of all previously unchosen elements of said sets of first and second maximum values until all elements of each have been so selected;

(iv) repeating steps (i) to (iii) in respect of each successive set of first and second maximum values until each said successive set ultimately comprises only one element;

(v) subtracting the value of the one element of said ultimate successive set of first maximum values from that of the one element of said ultimate successive set of second maximum values so as to provide a Log-Likelihood Ratio.

Thus, the calculation of the Log-Likelihood Ratio (LLR) for a given encoder transition (time step within the encoder trellis) may be further accelerated by performing in parallel the processing of date produced by the extended LM_ACS operation, thus providing an accelerated LLR (LLR_ACC) operation.

Preferably, in the invention according to its second aspect, the correction term:

$$\ln(1+\exp(-\Delta))$$

is added to any quantity selected as being the maximum of two quantities compared for that purpose, where $\Delta$ is the absolute value of the difference between said quantities compared.

This correction factor, when added to the selected maximum value of the two quantities defining $\Delta$, results in the Jacobian logarithm of these two quantities, of which the selected maximum value is only an approximate.

In method for calculating LLRs according to the second aspect of the invention, the forward path metric values may be calculated according to a method comprising the steps of:

(i) adding to the path metric value associated with a first encoder state a first transition metric value associated with the transition of said encoder from said first encoder state to a first adjacent encoder state thereby providing a first path metric value for said first adjacent encoder state;

(ii) substantially simultaneously with step (i) adding to the path metric value associated with a second encoder state concurrent with said first state a second transition metric value associated with the transition of said encoder from said second encoder state to said first adjacent encoder state thereby providing a second path metric value for said first adjacent encoder state;

(iii) comparing said first path metric value for said first adjacent encoder state to said second path metric value therefore and selecting the maximum of the two to be the path metric value associated with that adjacent encoder state;

(iv) adding to the path metric value associated with said first encoder state said second transition metric value associated with the transition of said encoder from said first encoder state to a second adjacent encoder state concurrent with said first adjacent encoder state thereby providing a first path metric value for said second adjacent encoder state;

(v) substantially simultaneously with step (iv) adding to the path metric value associated with said second encoder state said second transition metric value associated with the transition of said encoder from said second encoder state to said second adjacent encoder state thereby providing a second path metric value for said second adjacent encoder state;

(vi) comparing said first path metric values for said second adjacent encoder state to said second path metric value therefore and selecting the maximum of the two to be the path metric value associated with that adjacent encoder state;

wherein the path metric values for all of said encoder states and said adjacent encoder states are forward path metrics calculated by forward recursion such that all of said adjacent encoder states succeed all of said encoder states, and the sequence of steps (i), (ii) and (iii) are performed substantially simultaneously with the sequence of steps (iv), (v) and (vi) respectively.

Thus, it will be appreciated that the forward path metrics used in the calculation of the LLR values may be determined in the LM_ACS operation.

Similarly, in the method for calculating LLRs according to the second aspect of the invention, the backward path metric values may be calculated according to a method comprising the steps of:

(i) adding to the path metric value associated with a first encoder state a first transition metric value associated with the transition of said encoder from said first encoder state to a first adjacent encoder state thereby providing a first path metric value for said first adjacent encoder state;

(ii) substantially simultaneously with step (i) adding to the path metric value associated with a second encoder state concurrent with said first state a second transition metric value associated with the transition of said encoder from said second encoder state to said first adjacent encoder state thereby providing a second path metric value for said first adjacent encoder state;

(iii) comparing said first path metric value for said first adjacent encoder state to said second path metric value therefore and selecting the maximum of the two to be the path metric value associated with that adjacent encoder state;

(iv) adding to the path metric value associated with said first encoder state said second transition metric value associated with the transition of said encoder from said first encoder state to a second adjacent encoder state concurrent with said first adjacent encoder state thereby providing a first path metric value for said second adjacent encoder state;

(v) substantially simultaneously with step (iv) adding to the path metric value associated with said second encoder state said second transition metric value associated with the transition of said encoder from said second encoder state to said second adjacent encoder state thereby providing a second path metric value for said second adjacent encoder state;

(vi) comparing said first path metric values for said second adjacent encoder state to said second path metric value therefore and selecting the maximum of the two to be the path metric value associated with that adjacent encoder state;

wherein the path metric values for all of said encoder states and said adjacent encoder states are backward path metrics calculated by backward recursion wherein all of said adjacent encoder states precede all of said encoder states, and the sequence of steps (i), (ii) and (iii) are performed substantially simultaneously with the sequence of steps (iv), (v) and (vi) respectively.

Thus, it will be appreciated that the backward path metrics used in the calculation of the LLR values may be determined in the LM_ACS operation.

Preferably, in the method according to the second aspect of the present invention the first value of parity bits output from said encoder is +1 and said second value thereof is −1. However, the first and second values may be other than +1 and −1 respectively, they need only differ.

In accordance with any-aspect of the present invention, there may be provided a method for calculating transition metric values ($\gamma$) for use in decoding wherein:

(i) the encoder transition associated with the output therefrom of a systematic and a parity bit of values −1 and −1 respectively is assigned a first transition metric value of $\gamma(-1,-1)=0$;

(ii) the encoder transition associated with the output therefrom of a systematic and a parity bit of values −1 and +1 respectively is assigned a second transition metric value of $\gamma(-1,+1)=s1$;

(iii) the encoder transition associated with the output therefrom of a systematic and a parity bit of values +1 and −1 respectively is assigned a third transition metric value $\gamma(+1,-1)=s2$;

(iv) the encoder transition associated with the output therefrom of a systematic and a parity bit of values +1 and +1 respectively is assigned a transition metric value $\gamma(+1,+1)$ equal to the sum of said first and second transition metric values;

where the terms s1 and s2 are dependent on the signal-to-noise ratio associated with the received bit sequence, the received parity and systematic bits corresponding with the bits output from the encoder, and at least an estimate of the a priori probability of the encoder transition.

Thus, it will be appreciated that calculation of the four possible transition metric values is substantially simplified in only requiring two terms to be calculated (i.e. s1 and s2). Preferably, $s1=4 \cdot SNR \cdot y_k^p$ and $s2=4 \cdot SNR \cdot y_k^s + z_k$, where SNR is the signal-to-noise ratio associated with the received bit sequence, $Y_k^p$ and $Y_k^s$ are received parity and systematic bits, and $Z_k$ is at least an estimate of the a priori probability of the encoder transition at time step k respectively.

The present invention also proposes a digital signal processor (DSP) for accelerating the operation of a Log-MAP decoding algorithm by at least performing each step of an Add-Compare-Select (ACS) operation in respect of one state of one concurrent pair of states of a trellis butterfly in parallel with each corresponding step of an Add-Compare-Select operation in respect of the other state of the one concurrent pair of states, in accordance with any of the methods described above. The ACS operation may form part of a path metric update or part of a Log-Likelihood Ratio calculation.

Thus, the invention may provide a digital signal processor for calculating path metric values of a convolutional encoder for use in decoding, according to a Log-MAP algorithm, a bit sequence encoded thereby and received through a noisy channel, the processor comprising:

a transition metric calculating unit for receiving from a memory store of the digital signal processor data concerning said bit sequence, for calculating transition metric values representing transitions between states of a convolutional encoder, and for outputting those calculated metric values;

an Add-Compare-Select unit for receiving said calculated transition metric values, for receiving path metric values derived from said calculated transition metric values, for deriving updated path metric values from said path metric values and said transition metric values, and for outputting these updated path metric values wherein the updated path metric values are derived in accordance with the method of the first aspect of the invention.

Thus, the DSP provides updated path metric values, either forward or backward, for use in decoding a bit sequence. It will be appreciated that the ACS unit of the DPS may be employed not only to update forward or backward path metric values by adding these to successive transition metric values in accordance with the first aspect of the present invention, but the ACS unit may also be employed in calculating updated path metric and LLR values in accordance with the second aspect of the invention.

Preferably, the transition metric calculating unit employs the method of calculating transition metric values ($\gamma$) described above. The transition metric calculating unit may output calculated transition metric values to a memory store of the DSP to which the ACS unit is also connected for the purposes of receiving transition metric values therefrom. The ACS unit preferably receives path metric values and transition metric values from the memory store of the DSP, and outputs updated path metric values thereto for storage in that memory store.

A transition metric cache may be provided in the DSP into which the metric calculating unit outputs and stores the calculated transition metrics associated with a given time step of the encoder trellis being decoded, and the ACS unit may receive those transition metric values from the transition metric cache for use in deriving updated path metric values.

Thus, since for each trellis time step, only four transition metric values are required in order to process each of the concurrent butterflies of the time step, by storing the four values in a temporary cache store the need to repeatedly retrieve the values from the main memory store of the DSP is obviated. This helps to increase the efficiency of the signal processor.

Preferably the ACS unit of the DSP comprises:

a calculation unit having a number of data input ports, two data output ports;

wherein the calculation unit is operable to add path metric values to transition metric data values concurrently received at the data input ports thereof to provide two concurrent pairs of updated path metric values, to compare within each concurrent pair said updated path metric values and to output at said two data output ports thereof the maximum path metric value of each concurrent pair.

Thus, the ACS unit may update either forward or backward path metrics in accordance with the first aspect of the invention or with the second aspect when employed in calculating LLRs. The calculation unit may have a first data input port for receiving path metric data values, a second data input port for receiving transition metric data values, a third data input port for receiving path metric data values, and a fourth data input port for receiving transition metric data values.

The ACS unit may have function-selection apparatus which permits the function of the ACS to be that of producing updated forward or backward path metrics in accordance with the first aspect of the invention, or to be that of producing the elements of the first and second sets of maximum values for use in calculating LLRs in accordance with the second aspect of the invention.

The function-selection apparatus preferably comprises:

a first data input gate connected in-between the two data output ports of the calculation unit and two feedback data input ports of the calculation unit of the ACS unit;

a second data input gate connected to the second and fourth data input ports of the calculation unit and to a fifth data input port thereof;

a third data input gate connected to the second and fourth data input ports of the calculation unit and to a sixth data input port thereof;

wherein the function-selection apparatus is operable to select the data values to be input to the feedback data input ports, and the fifth and sixth data input ports of the calculation unit.

The input-selection apparatus preferably has two selection states, each of which determine the function of the ACS unit.

Preferably in a first selection state of the function selection apparatus, the first data input gate blocks data output from the calculation unit and causes data input at the two feedback data input ports thereof to have a value of zero, while concurrently the second data input gate causes transition metric data input at the fourth input port of the calculation unit to be simultaneously input at the fifth data input thereof, and concurrently the third data input gate causes transition metric data input at the second input port of the calculation unit to be simultaneously input at the sixth data input port thereof.

Thus, in this first selection state, the input selection apparatus may cause the ACS unit to function so as to update path metric values in accordance with the first aspect of the present invention since for each adder means the two transition metric values simultaneously input thereto represent different transition metrics.

In a second selection state of the function selection apparatus, the first data input gate preferably permits data to pass from the outputs of the calculation unit to the two feedback data input ports thereof, while concurrently the second data input gate causes transition metric data input at the second input port of the calculation unit to be simultaneously input at the fifth data input thereof, and concurrently the third data input gate causes transition metric data input at the fourth input port of the calculation unit to be simultaneously input at the sixth data input port thereof.

Hence, in its second selection state, the input selection apparatus permits the ACS unit to function so as to calculate the elements of the sets of first and second maximum values for use in LLR calculations according to the second aspect of the present invention. That is to say, the two path metric values simultaneously input to any one adder means are made to be the same path metric and are input concurrently with backward path metric values.

The DSP is preferably provided with a Log-Likelihood Ratio unit for calculating LLR values from the set of first maximum values and the set of second maximum values in accordance with the LLR acceleration (LLR_ACC) methods derived above relating to the second aspect of the present invention, and for outputting calculated LLRs to the memory store of the DSP. The Log-Likelihood Ratio unit is preferably connected to the cache apparatus such as to be able to retrieve any data elements of the sets of first maximum values and second maximum values when stored therein, and to be able to store therein elements of successive sets of first and second maximum values produced by the Log-Likelihood Ratio unit.

Preferably, the Log-Likelihood Ratio unit comprises:

cache apparatus operable to store said set of first maximum values, said set of second maximum values and said successive sets thereof;

two compare-and-select units, each one possessing a first data input port connected to a data output port of said cache apparatus, a second data input port connected to a data output port of said cache apparatus, and a data output port connected to a data input port of said cache apparatus;

wherein one of said compare-and-select units is operable to receive at its first and second data input ports elements of said set of first maximum values output form said cache apparatus, and the other of said compare-and-select units is operable to receive at its first and second data input ports elements of said set of second maximum values output from said cache apparatus, each said compare-and-select unit being operable to compare concurrent first and second inputs and to output via said output port the element which is the maximum of the two.

Preferably, in the aforementioned Log-Likelihood Ratio unit, the element output from both compare-and-select units is input into said cache apparatus for storage as an element in the respective successive set of maximum values. The data output port of each of the two compare-and-select units is preferably connected to a respective one of a first input port and a second input port of a subtraction unit which is operable to subtract the data at one input port thereof from the data at the other input port thereof, and to output the result.

Preferably, each compare-and-select unit of the Log-Likelihood Ratio unit includes a subtraction unit connected to said first and second input ports of the two compare-and-select means, wherein the subtraction unit is operable to subtract data input at said first input port from data concurrently input at said second input port and to output the sign and the absolute magnitude of the result.

Preferably, each compare-and-select unit includes a selecting unit having a first and second input port respectively connected to said first and second input ports of the compare-and-select unit, wherein the selecting unit is operable to receive as a further input the sign output from said subtracting unit and to output the data input via one of its first and second input ports in dependence upon the value of said sign.

Each compare-and-select unit may include correcting apparatus for adding to the output of said selecting unit a correction factor substantially equal to $\ln(1+\exp(-\Delta))$ where $\Delta$ is the absolute value of the result output from said subtracting unit.

This correction factor, when added to the selected maximum value of the two quantities defining $\Delta$, results in the Jacobian logarithm of these two quantities, of which the selected maximum value is only one approximation.

Preferably, said correcting apparatus comprises:

a look-up table possessing a plurality of correction values and having an input port connected to the output port of said subtracting unit and an output port; and, an adder means having a first input port connected to said output port of the look-up table and having a second input port connected to the output port of said selecting unit;

wherein said adder means is operable to add to the output of said selecting unit a correction term output from said look-up table.

The invention may also provide a turbo decoder comprising a plurality of Log-MAP decoders wherein:

each Log-MAP decoder comprises branch metric calculating apparatus for calculating transition metric values ($\gamma$) according to the above methods.

The invention may provide a turbo decoder comprising a plurality of Log-MAP decoders wherein:
   each Log-MAP decoder comprising path metric calculating apparatus for calculating path metric values of said encoder according to the first aspect of the present invention.

The present invention may also provide a turbo decoder comprising a plurality of Log-MAP decoders wherein:
   each Log-MAP decoder comprising Log-Likelihood Ratio unit for calculating Log-Likelihood Ratio values of said encoder according to the second aspect of the present invention.

There now follows a non-limiting example of the present invention with reference to the following figures.

Figure 3:
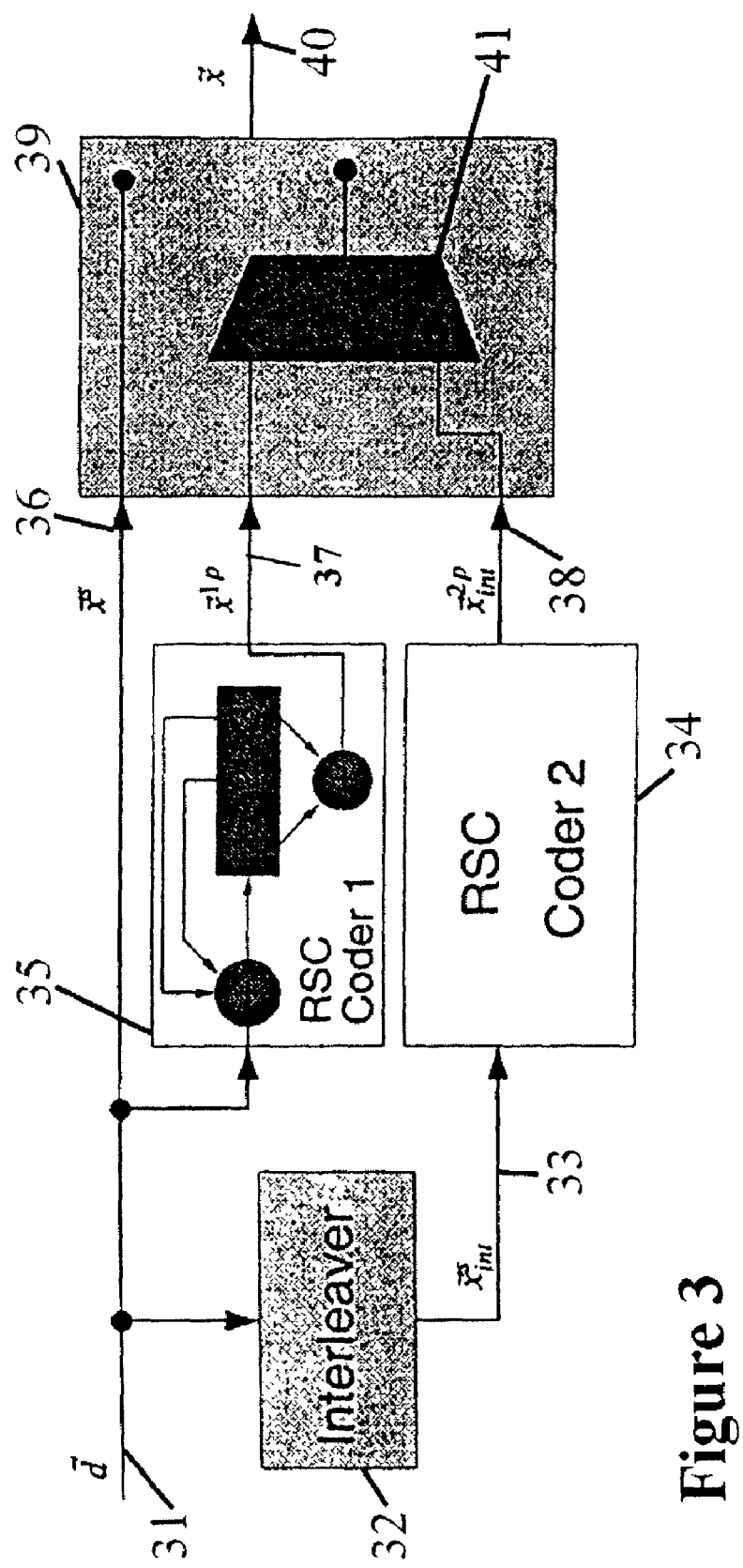
FIG. 3 illustrates a Turbo-Code encoder comprising two RSC encoders in parallel concatenation providing constituent codes of the Turbo-Code.

Referring to FIG. 3 there is illustrated the structure of a Turbo-Code encoder. The Turbo-Code encoder comprises data input 31 connected to the data inputs of two identical constituent recursive systematic convolutional (RSC) encoders 34 and 35 connected in parallel concatenation. The block data sequence to be encoded, $\vec{d}=(d_1,\ldots,d_N)$ where N is the block size, is input at the data input 31 of the Turbo-Code encoder and subsequently input to each one of the two identical constituent code encoders 34 and 35. The second of the two constituent RSC encoders 34 receives the block data via an interleaver 32. Interleaving places the block sequence $\vec{d}=(d_1,\ldots,d_N)$ into a different order before inputing that re-ordered data block sequence 33 ($\vec{x}^s_{int}$) into the second RSC encoder 34. In this way the effects of burst errors in any one data block may be reduced.

Each constituent RSC encoder produces parity bits for use in forward error correction of the data block input thereto. The first encoder 35 outputs a parity bit sequence $\vec{x}^{1p}$, while the second encoder 34 outputs a parity bit sequence $\vec{x}^{2p}_{int}$ associated with the interleaved data block input thereto. Due to the parallel concatenation of the systematic information ($\vec{x}^s$) and the parity information ($\vec{x}^{1p},\vec{x}^{2p}_{int}$), three output bits are generated for each bit $d_k$ of the input data sequence $\vec{d}=(d_1,\ldots,d_N)$. These three outputs are subsequently input to separate respective inputs 36, 37 and 38 of the multiplexer 39.

Puncturing unit 41 ensures that certain bits are removed from the parity bit-stream input to the multiplexer 39 and are not transmitted. For example, every second bit of the parity information may be punctured, leading to the transmitted data sequence $\vec{x}=(x_1^s,x_1^{1p},x_2^s,x_{int,2}^{2p},\ldots,x_{N-1}^s,x_{N-1}^{1p},x_N^s,x_{int,N}^{2p})$ in which sucessive parity bits (denoted $x^{1p}$) are taken from the first encoder 35 alternately with parity bits (denoted $x^{2p}$) are taken from the second encoder 34.

Figure 4:
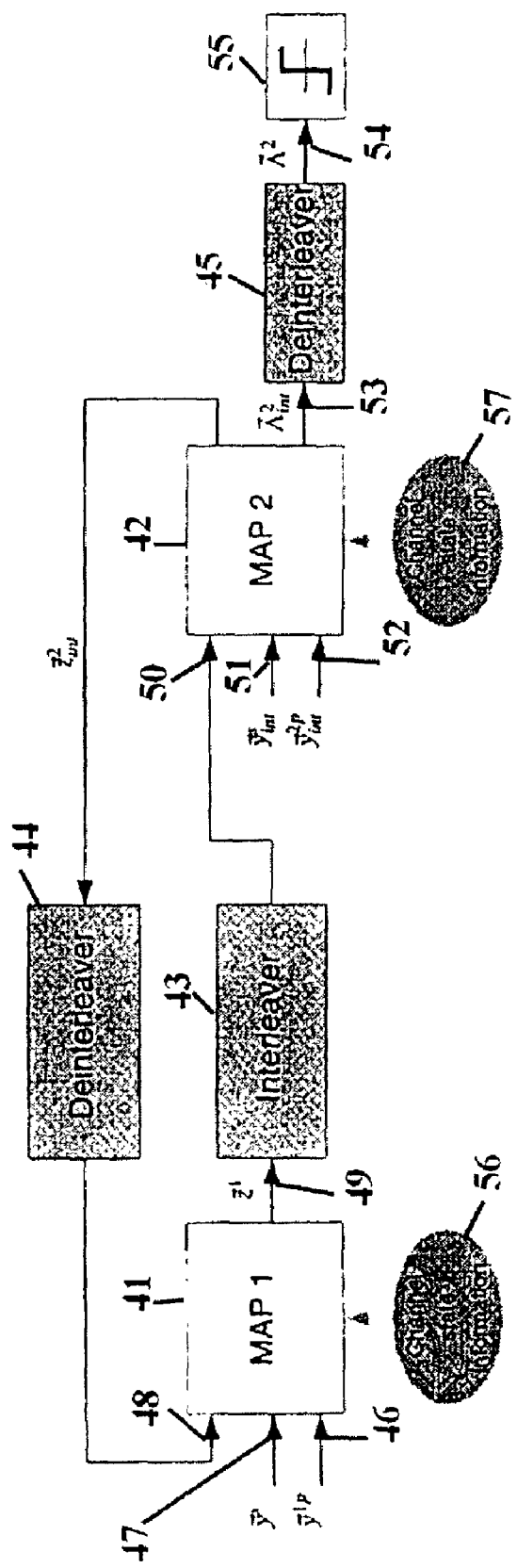
FIG. 4 illustrates a Turbo-Decoder employing two maximum a posteriori probability (MAP) decoders.

FIG. 4 illustrates a Turbo-Decoder employing a first maximum a posteriori probability (MAP) decoder 41 connected in series with a second MAP decoder 42 via an interleaver 43. The first MAP decoder 41 has three inputs: the systematic data input 47 (denoted $\vec{y}^s$), the parity data input 46 (denoted $\vec{y}^{1p}$) associated with the output of the first RSC encoder 35, and the extrinsic information 48 (denoted $\vec{z}^2$) output from the second MAP decoder 42 and received via the an intermediate interleaver 44. The extrinsic information serves as a priori information.

With this information and channel state information 56, the first MAP decoder 41 calculates for each bit $d_k$ of the input data sequence $\vec{d}=(d_1,\ldots,d_N)$ the MAP Log-Likelihood Ratio value:

$$\Lambda_1(d_k)=\log\frac{Pr\{d_k=1\mid\vec{R}\}}{Pr\{d_k=0\mid\vec{R}\}},$$

where $\vec{R}=(R_1,\ldots,R_k,\ldots,R_N)$ and $R_k=(y_k^s,y_k^{1p},z_k^2)$, which can be written as:

$$\Lambda hu 1(d_k)=z_k^1+c\cdot y_k^s+z_k^2$$

with c=4×SNR, the quantity SNR being the signal-to-noise ratio associated with the received data signal. The systematic term $c\cdot y_k^s$ and the a priori term $z_k^2$ are regarded as independent of the parity information for the bit $d_k$.

The newly generated extrinsic information can therefore be computed as:

$$z_k^1=\Lambda^1(d_k)-c\cdot y_k^s-z_k^2$$

which is output at the data output 49 of the first MAP decoder 41 and serves, after interleaving by intermediate interleaver 43, as a priori information $z_{k,int}^1$ for input at one of the data inputs 50 of the second MAP decoder 42. This information is input to the second MAP decoder 42 together with interleaved systematic data $\vec{y}_{k,int}^s$ at another data input 51 thereof, interleaved parity data $\vec{y}_{int}^{2p}$ (from the second RSC encoder 34) at a further data input 52 thereof, and channel state information 57. The second MAP decoder 42 computes extrinsic information as:

$$z_{k,int}^2=\Lambda^2(d_{k,int})-c\cdot y_{k,int}^s-z_{k,int}^1$$

which is subsequently de-interleaved by the de-interleaver 44 connected between the extrinsic information output of the second MAP decoder 42 and the a priori information input 48 of the first MAP decoder 41. This procedure iterates several times until the MAP estimates $\vec{\Lambda}^{1,2}$ stabilise, whereupon the stabilised MAP estimate $\vec{\Lambda}_{int}^2$ is output from the output port 53 of the second MAP decoder 42 to the input of a second de-interleaver 45 for de-interleaving thereby. The de-interleaver MAP estimate of the Log-Likelihood Ratio $\vec{\Lambda}^2$ is subsequently output from the second de-interleaver 45 to a decision circuit 55 for use in decoding the received bit sequence $\vec{y}$.

It is preferable to implement this MAP decoding in the (natural) logarithmic domain in order to avoid numerical problems without degrading decoding performance. In the logarithmic domain, each of the first and second MAP decoders 41 and 42 operate as Log-MAP decoders which compute log-likelihood ratios as follows:

$$\Lambda(d_k) = \max^*{}_{(S_k, S_{k-1})}\{\overline{\gamma}_1[(y_k^s, y_k^p), S_{k-1}, S_k]\overline{\alpha}_{k-1}(S_{k-1}) + \overline{\beta}_k(S_k)\}$$

$$-\max^*{}_{(S_k, S_{k-1})}\{\overline{\gamma}_0[(y_k^s, y_k^p), S_{k-1}, S_k]\}$$

where the max* operation is in respect of all states $S_{(k,k-1)}$ involved in transitions between trellis states at time step k−1 and time step k, and $$\overline{\gamma}_i[(y_k^s, y_k^p), S_{k-1}, S_k] = 2 \cdot SNR \cdot y_k^s x_k^s(i) + 2 \cdot SNR \cdot y_k^p x_k^p(i, S_k, S_{k-1}) + \ln(Pr\{S_k|S_{k-1}\})$$

are the branch metrics γ (with i=0,1) represented in the logarithmic domain, $\ln(Pr\{S_k|S_{k-1}\})$ being the a priori information. Branch metrics with i=0 correspond to branches of the encoder trellis associated with the output by the Turbo-Code encoder of a "zero" bit, while those with i=1 correspond to the output of a "one" bit.

It is to be noted that prior to transmission, every data bit output from the Turbo-Code encoder is subject to transformation. Data bits $x_k^s$ and $x_k^p$ are transformed according to the relation $x \to 2 \cdot x - 1$; $y \to 2 \cdot y - 1$ such that "zero" bits are transmitted as "−1" bits.

Using these branch metrics, the forward path metrics $\overline{\alpha}_k$ in the log domain, and backward path metrics $\overline{\beta}_k$ in the log domain, are calculated recursively using the following relations:

$$\overline{\alpha}_k(S_k) = \max^*{}_{(S_{k-1}, i)}\{\overline{\gamma}_i[(y_k^s, y_k^p), S_{k-1}, S_k] + \overline{\alpha}_{k-1}(S_{k-1})\},$$

and $$\overline{\beta}_k(S_k) = \max^*{}_{(S_{k+1}, i)}\{\overline{\gamma}_i[(y_{k+1}^s, y_{k+1}^p), S_k, S_{k+1}] + \overline{\beta}_{k+1}(S_{k+1})\}.$$

The operator term max* is the Jacobian logarithm of the quantities operated on thereby, of which the selected maximum (max) value is only an approximation (i.e. $\max^*(a,b) = \ln(e^a + e^b) = \max(a,b) + \ln(1 + e^{-\Delta}), \Delta = |a-b|$). The present invention may operate according to the sub-optimal approximation $\max^*(a,b) \approx \max(a,b)$ which omits the logarithmic correction term, but the present embodiment does not omit this term.

It will be appreciated that the four main tasks of each one of the two the Log-MAP decoders 41 and 42 of FIG. 4 are the calculation of branch metrics for use in the calculation of forward and backward path metrics (i.e. path metric updating) and for use together with those updated path metrics in the calculation of Log-Likelihood Ratios (i.e. "soft" output data). According to the present embodiment, each of the Log-MAP decoders 41 and 42 comprises a digital signal processor for decoding received information according to the present invention. Usually, the two Log-MAP decoders are mapped to one single DSP.

According to this embodiment, the branch metrics are calculated from the received systematic and parity information bits along with channel state information and a priori information. Assuming the sent symbols $x_k \in \{-1, 1\}$, the probabilities for the systematic and parity bits $y_k$ received through a channel subject to additive white Gaussian noise are defined by:

$$\overline{\gamma}_i[(y_k^s, y_k^p), S_{k-1}, S_k] = 2 \cdot SNR \cdot y_k^s x_k^s(i) + 2 \cdot SNR \cdot y_k^p x_k^p(i, S_k, S_{k-1}) + \ln(Pr\{S_k|S_{k-1}\})$$

in the logarithmic domain. The a priori information $\ln(Pr\{S_k|S_{k-1}\})$ required by any one of the two Log-MAP decoders 41 and 42 of the Turbo-Code decoder is directly deduced from the extrinsic information ($z^{1,2}$) calculated by the other of the two decoders. If a transition $S_{k-1}^m \to S_k^{m'}$ is possible according to the trellis and $d_k$, from trellis node m at time k−1 to trellis node m' at time step k, then:

$$\ln(Pr\{S_k|S_{k-1}\}) = z_k; \text{ for } d_k = 1$$

$$\ln(Pr\{S_k|S_{k-1}\}) = 0; \text{ for } d_k = 0.$$

Thus, the a priori information $\ln(Pr\{S_k|S_{k-1}\})$ required by any one of the two Log-MAP decoders 41 and 42 of the Turbo-Code decoder is directly deduced from the extrinsic information ($z^{1,2}$) calculated by the other of the two decoders.

A total of four different branch metric values are possible at each trellis time step k, one for each of the four combinations of the two possible received systematic data bits $y_k^s \in \{-1, 1\}$, and parity bits $y_k^p \in \{-1, 1\}$:

$$\overline{\gamma}(x_k^s = -1, x_k^p = -1) = -2 \cdot SNR \cdot (y_k^s + y_k^p)$$

$$\overline{\gamma}(x_k^s = -1, x_k^p = +1) = -2 \cdot SNR \cdot (-y_k^s + y_k^p)$$

$$\overline{\gamma}(x_k^s = +1, x_k^p = -1) = -2 \cdot SNR \cdot (y_k^s - y_k^p) + z_k$$

$$\overline{\gamma}(x_k^s = +1, x_k^p = +1) = -2 \cdot SNR \cdot (y_k^s + y_k^p) + z_k.$$

The structure of the Turbo-Code encoder determines which transition metric is assigned to a given transition. Simplification of the calculation of these branch metrics is achieved by adding the term $(2 \cdot SNR \cdot (y_k^s + y_k^p))$ to each of the above four equations, yielding:

$$\overline{\gamma}_k^{0,0} = \overline{\gamma}(x_k^s = -1, x_k^p = -1) = 0$$

$$\overline{\gamma}_k^{0,1} = \overline{\gamma}(x_k^s = -1, x_k^p = +1) = s1$$

$$\overline{\gamma}_k^{1,0} = \overline{\gamma}(x_k^s = +1, x_k^p = -1) = s2$$

$$\overline{\gamma}_k^{1,1} = \overline{\gamma}(x_k^s = +1, x_k^p = +1) = s1 + s2$$

where $s1 = 4 \cdot SNR \cdot y_k^p$ and $s2 = 4 \cdot SNR \cdot y_k^s + z_k$. Thus, only two terms have to be calculated by either Log-MAP decoder 41 and 42, from the received data bits.

Figure 1:
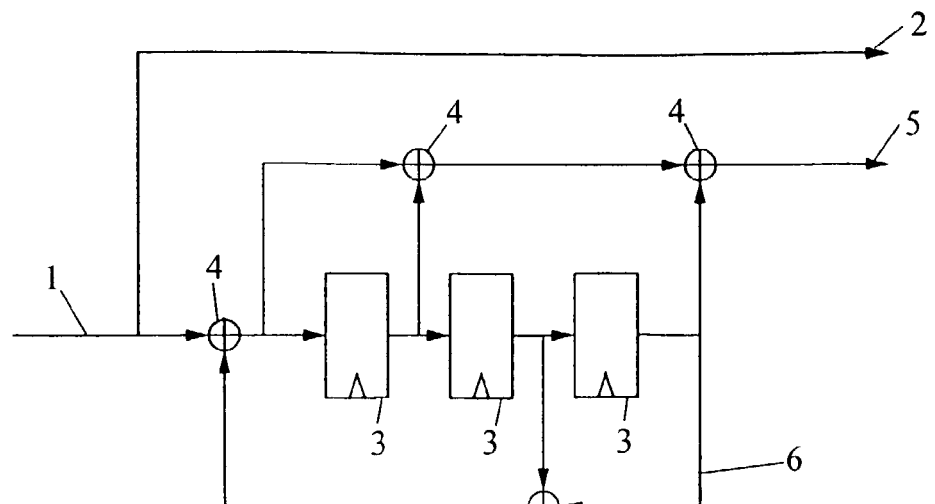
FIG. 1 illustrates a recursive systematic convolutional (RSC) encoder.
Figure 2:
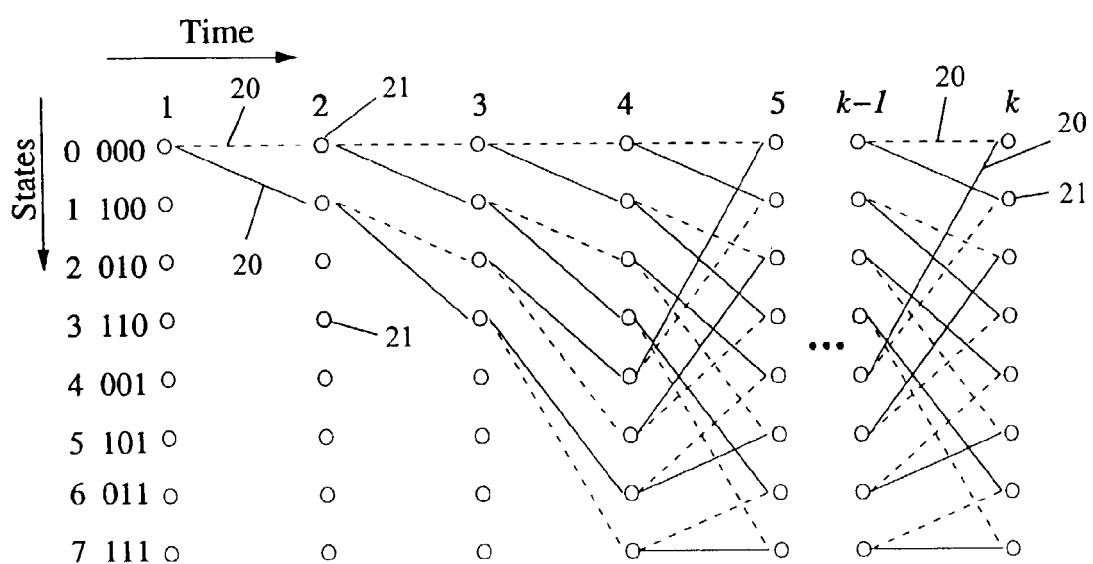
FIG. 2 illustrates an encoder trellis associated with the RSC encoder of FIG. 1.
Figure 5:
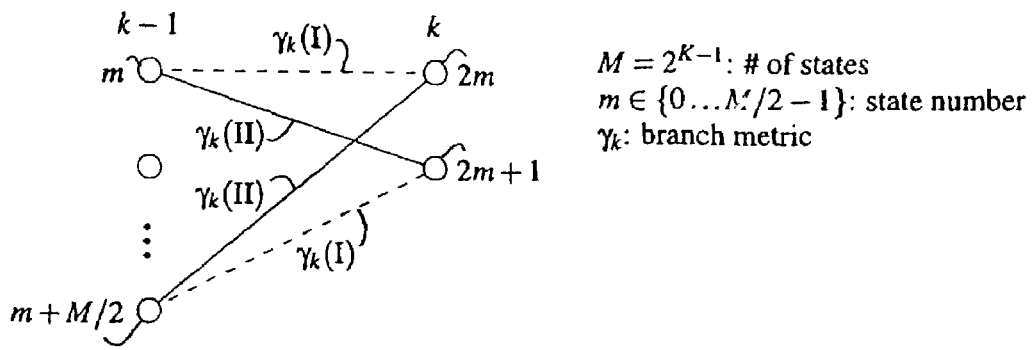
FIG. 5 illustrates a Log-Map trellis butterfly.

In the portion of the trellis of the binary convolutional Turbo-Code encoder of FIG. 3 from a time step k−1 to k, the transitions between neighbouring states of the trellis can be segregated into disjoint groups of four each originating in a concurrent pair of states and terminating in another concurrent pair. The structure produced by these four states is known as a trellis "butterfly". FIG. 5 illustrates the Log-MAP butterfly of the Turbo-Code encoder of FIG. 3 which comprises a first concurrent pair of states m and m+M/2, and a second concurrent pair of states 2m and 2m+1. Here, M is the total number of possible states of the trellis (M=8 in FIG. 2), and m is a given state number.

Each one of the states of the first pair (m,m+M/2) is joined to each one of the second pair of states (2m,2m+1) by a respective one of a pair of distinct branch metrics $\gamma_k(I)$ and $\gamma_k(II)$. Each of these two branch metrics takes a value given by one of the four possible values given above. The first branch metric of the pair is associated with the output by the encoder of a parity bit of a first binary value and the second one of the pair is associated with the output by the encoder of a parity bit of a second binary value (e.g. parity bit 0, and parity bit 1 respectively).

The forward branch metrics $\alpha_k$ associated with the first pair of states (m,m+M/2) of the butterfly are updated by adding the relevant transition metric thereto so as to extend that path metric to one of the second pair of states (2m,2m+1) according to the following equations:

$$\alpha_k((2m))=\max^*(\alpha_{k-1}(m)+\gamma_k(I),\alpha_{k-1}(m+M/2)+\gamma_k(II))$$

$$\alpha_k((2m+1))=\max^*(\alpha_{k-1}(m)+\gamma_k(II),\alpha_{k-1}(m+M/2)+\gamma_k(I))$$

Similarly, the backward branch metrics $\beta_k$ associated with the second pair of states (2m,2m+1) of the butterfly are updated by adding the relevant transition metric thereto so as to extend that path metric to one of the first pair of states (m,m+M/2) according to the following equations:

$$\beta_{k-1}(m)=\max^*(\beta_k(2m)+\gamma_k(I),\beta_k(2m+1)+\gamma_k(II))$$

$$\beta_{k-1}(m+M/2)=\max^*(\beta_k(2m)+\gamma_k(II),\beta_k(2m+1)+\gamma_k(I))$$

It will be readily appreciated that in updating any concurrent pair of states of a Log-MAP butterfly according to these equations, the same four data items are used for each state of the pair. That is to say, the same two path metrics to the state being updated, and the same two transition metric values for achieving that update are used for updating each state of a concurrent butterfly pair.

Each state update requires three successive steps: the addition of transition metric values to each of the two branch metrics of a concurrent pair; a comparison of the two resulting updated branch metrics; and a selection of the maximum value of the two. Thus, implementation of each of the above updating equations requires an Add-Compare-Select "ACS" operation.

At its most general, the present invention proposes to accelerate the operation of a Log-MAP decoding algorithm by at least performing each step of an Add-Compare-Select (ACS) operation in respect of one state of one concurrent pair of states of a trellis butterfly in parallel with each corresponding step of an Add-Compare-Select operation in respect of the other state of the one concurrent pair of states. The ACS operation may form part of a path metric update or part of a Log-Likelihood Ratio calculation.

Accordingly, the Log-MAP ACS operation "LM_ACS" is introduced. This operation is performed on a trellis butterfly and comprises the steps of:

(i) adding to the path metric value associated with a first encoder state a first transition metric value associated with the transition of the encoder from the first encoder state to a first adjacent encoder state thereby providing a first updated path metric value for the first adjacent encoder state;

(ii) substantially simultaneously with step (i) adding to the path metric value associated with a second encoder state concurrent with the first state a second transition metric value associated with the transition of the encoder from the second encoder state to the first adjacent encoder state thereby providing a second updated path metric value for the first adjacent encoder state;

(iii) comparing the first updated path metric value for the first adjacent encoder state to the second updated path metric value therefor and selecting the maximum of the two to be the updated path metric value associated with that adjacent encoder state;

(iv) adding to the path metric value associated with the first encoder state the second transition metric value associated with the transition of the encoder from the first encoder state to a second adjacent encoder state concurrent with the first adjacent encoder state thereby providing a first updated path metric value for the second adjacent encoder state;

(v) substantially simultaneously with step (iv) adding to the path metric value associated with the second encoder state the second transition metric value associated with the transition of the encoder from the second encoder state to said second adjacent encoder state thereby providing a second updated path metric value for the second adjacent encoder state;

(vi) comparing said first updated path metric values for the second adjacent encoder state to the second updated path metric value therefore and selecting the maximum of the two to be the updated path metric value associated with that adjacent encoder state.

In this operation, the sequence of steps (i), (ii) and (iii) are performed substantially simultaneously with the sequence of steps (iv), (v) and (vi) respectively.

The max* operation is defined by:

$$\max^*(a,b)=\max(a,b)+\ln(1+\exp(-|a-b|)).$$

The correction term $\ln(1+\exp(-|a-b|))$ being added to the result of the result of the ACS operation associated with the "max" operation to provide the full Jacobian logarithm of which the "max" operator is only an approximation. This is implemented in the digital signal processor of the present embodiment by use of a small look-up table (LUT) as will be explained in more detail below.

Figure 6:
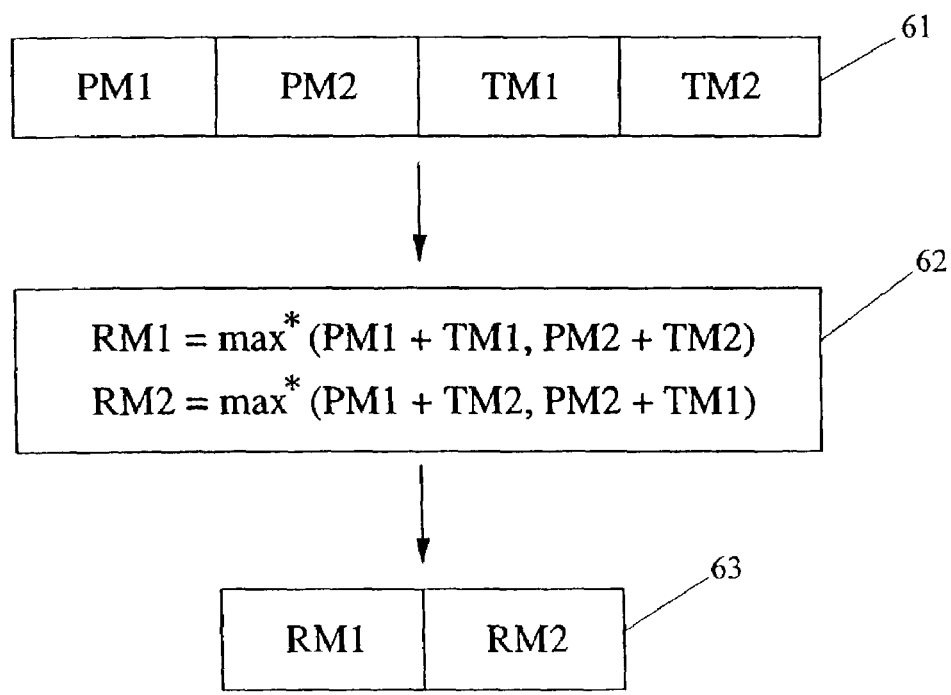
FIG. 6 illustrates a flow diagram outlining the operation of the accelerated Log-MAP decoding algorithm (LM_ACS)

FIG. 6 schematically illustrates the steps of the LM_ACS operation. The functionality of this operation is based upon the structure of the four path metric update equations defined above. The first step 61 of the LM_ACS operation requires the simultaneous provision by the digital signal processor of two path metric values (PM1,PM2) of a concurrent Log-MAP butterfly pair, and of two distinct transition metric values (TM1, TM2) for use in the second step 62 of the operation of updating that pair in two simultaneous "max*" operations. Updated path metrics (RM1,RM2) are simultaneously produced as a result 63.

Figure 7:
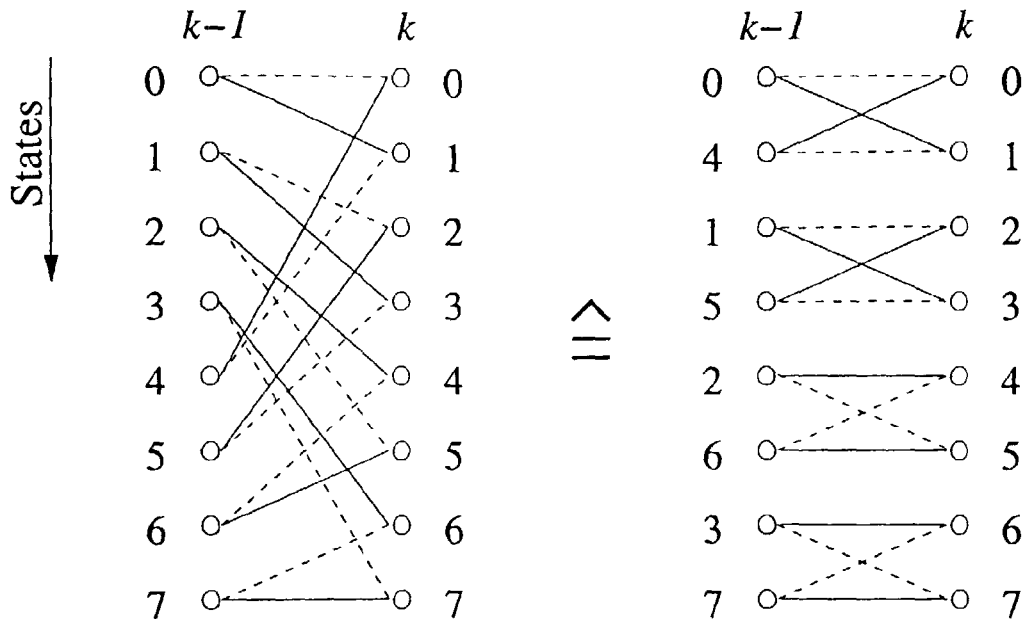
FIG. 7 illustrates a schematic representation of an update of a Log-MAP trellis time step mapped onto Log-MAP butterflies of the trellis.

Each complete path metric update of this type at a time step k can be mapped onto an m-fold execution of the LM_ACS operation:

$$(RM1,RM2)=LM\_ACS(PM1,PM2,TM1,TM2)$$

by the digital signal processor as depicted in FIG. 7 for an 8-state encoder trellis. The parameters $\gamma_k(I)$ and $\gamma_k(II)$ of the Log-MAP butterfly of FIG. 5 correspond with the transition metric values TM1 and TM2. It will be appreciated that, with this assignment, the first two Log-MAP butterflies of FIG. 7 correspond with the butterfly of FIG. 5 with regard to the allocation of dashed and solid lines (transition metric values). As a common operation is defined for all butterflies, the order of the branch metrics must be exchanged when the digital signal processor (DSP) computes the last two butterflies of FIG. 7 (right-hand column).

In order to update the forward path metrics of the eight states (m=0, . . . ,m=7) of the encoder trellis segment of FIG. 7 from time k−1 to time k, the LM_ACS operation must be performed by the DSP four times as follows:

$$(\alpha_k(0),\alpha_k(1))=LM\_ACS(\alpha_{k-1}(0),\alpha_{k-1}(4),\gamma_k^{0,0},\gamma_k^{1,1})$$

$$(\alpha_k(2),\alpha_k(3))=LM\_ACS(\alpha_{k-1}(1),\alpha_{k-1}(5),\gamma_k^{0,1},\gamma_k^{1,0})$$

$$(\alpha_k(4),\alpha_k(5))=LM\_ACS(\alpha_{k-1}(2),\alpha_{k-1}(6),\gamma_k^{1,0},\gamma_k^{0,1})$$

$$(\alpha_k(6),\alpha_k(7))=LM\_ACS(\alpha_{k-1}(3),\alpha_{k-1}(7),\gamma_k^{1,1},\gamma_k^{0,0})$$

During the updating of these forward path metrics, all updated path metrics ($\alpha_k(0)$, . . . ,$\alpha_k(7)$) are stored for every time step k in a memory store of the DSP for later use in Log-Likelihood Ratio calculations. As every two LM_ACS operations use the same pair of branch metrics, either ($\gamma_k^{0,0},\gamma_k^{1,1}$) or ($\gamma_k^{0,1},\gamma_k^{1,0}$) the buffering of these branch metric values in a transition metric cache can reduce the required bandwidth of the main memory store of the DSP and enhance its efficiency.

The updating of backward path metrics is achieved by the DSP according to the following:

$$(\beta_{k-1}(0),\beta_{-1k}(4))=LM\_ACS(\beta_k(0),\beta_k(1),\gamma_k^{0,0},\gamma_k^{1,1})$$

$$(\beta_{k-1}(1),\beta_{k-1}(5))=LM\_ACS(\beta_k(2),\beta_k(3),\gamma_k^{0,1},\gamma_k^{1,0})$$

$$(\beta_{k-1}(2),\beta_{k-1}(6))=LM\_ACS(\beta_k(4),\beta_k(5),\gamma_k^{1,0},\gamma_k^{0,1})$$

$$(\beta_{k-1}(3),\beta_{k-1}(7))=LM\_ACS(\beta_k(6),\beta_k(7),\gamma_k^{1,1},\gamma_k^{0,0})$$

By combining the backward path metric update with Log-Likelihood Ratio (LLR) calculations, the DSP is able to directly use backward path metric values calculated (and stored) in this way at time step k for use in LLR calculations later. Only 2M backward path metric values need to be stored by the DSP, the values being for time-steps k and k−1.

The calculation of LLR values for the eight-state encoder trellis section of FIG. 7, from time k−1 to time k may be written as follows:

$$\Lambda_k = \max \cdot \begin{Bmatrix} \alpha_k(4)+\gamma_k^{0,1}+\beta_k(0), \\ \alpha_k(0)+\gamma_k^{0,1}+\beta_k(1), \\ \alpha_k(5)+\beta_k(2), \\ \alpha_k(1)+\beta_k(3), \\ \alpha_k(2)+\beta_k(4), \\ \alpha_k(6)+\beta_k(5), \\ \alpha_k(3)+\gamma_k^{0,1}+\beta_k(6), \\ \alpha_k(7)+\gamma_k^{0,1}+\beta_k(7), \end{Bmatrix} - \max \cdot \begin{Bmatrix} \alpha_k(0)+\beta_k(0), \\ \alpha_k(4)+\beta_k(1), \\ \alpha_k(1)+\gamma_k^{0,1}+\beta_k(2), \\ \alpha_k(5)+\gamma_k^{0,1}+\beta_k(3), \\ \alpha_k(6)+\gamma_k^{0,1}+\beta_k(4), \\ \alpha_k(2)+\gamma_k^{0,1}+\beta_k(5), \\ \alpha_k(7)+\beta_k(6), \\ \alpha_k(3)+\beta_k(7), \end{Bmatrix}$$

This equation consists of two extended ACS operations and may be performed in three stages beginning with the partitioning of the equation into four butterflies as follows:

Stage 1:

llr1_s1_1=max*($\alpha_k(4)+\gamma_k^{0,1}+\beta_k(0)$, $\alpha_k(0)+\gamma_k^{0,1}+\beta_k(1)$)

llr0_s1_1=max*($\alpha_k(0)+\beta_k(0)$, $\alpha_k(4)+\beta_k(1)$)

llr1_s1_2=max*($\alpha_k(5)+\beta_k(2)$, $\alpha_k(1)+\beta_k(3)$)

llr0_s1_2=max*($\alpha_k(1)+\gamma_k^{0,1}+\beta_k(2)$, $\alpha_k(5)+\gamma_k^{0,1}+\beta_k(3)$)

llr1_s1_3=max*($\alpha_k(2)+\beta_k(4)$, $\alpha_k(6)+\beta_k(5)$)

llr0_s1_3=max*($\alpha_k(6)+\gamma_k^{0,1}+\beta_k(4)$, $\alpha_k(2)+\gamma_k^{0,1}+\beta_k(5)$)

llr1_s1_4=max*($\alpha_k(3)+\gamma_k^{0,1}+\beta_k(6)$, $\alpha_k(7)+\gamma_k^{0,1}+\beta_k(7)$)

llr0_s1_4=max*($\alpha_k(7)+\beta_k(6)$, $\alpha_k(3)+\beta_k(7)$)

followed by stage 2:

llr1_s2_1=max*(llr1_s1_1, llr1_s1_2)

llr0_s2_1=max*(llr0_s1_1, llr0_s1_2)

llr1_s2_2=max*(llr1_s1_3, llr1_s1_4)

llr0_s2_2=max*(llr0_s1_3, llr0_s1_4)

then ending in stage 3:

llr1_s3=max*(llr1_s2_1, llr1_s2_2)

llr0_s3=max*(llr0_s2_1, llr0_s2_2)

$\Lambda_k$=llr1_s3−llr0_s3

Thus, it will be appreciated that stage 1 of this process amounts to performing an extended LM_ACS operation four times, one for each of the four butterflies defined by (llr1_s1_1, llr0_s1_1), (llr1_s1_2, llr0_s1_2), (llr1_s1_3, llr0_s1_3), and (llr1_s1_4, llr0_s1_4).

The extended LM_ACS operation performed on each one of these four butterflies comprises the steps (i) to (iii) which are performed in respect of only those trellis transitions corresponding with a parity bit of a first value (e.g. bit 0), and steps (iv) to (vi) which are performed in respect of only those trellis transitions corresponding with a parity bit of a second value (e.g. bit 1):

(i) adding to the forward path metric value associated with a first encoder state of a given trellis butterfly; a first transition metric value associated with the forward transition of the encoder from the first encoder state to a first adjacent encoder state of the butterfly; and, the backward path metric value associated with the first adjacent encoder state to provide a first sum;

(ii) substantially simultaneously with step (i) adding to the forward path metric value associated with a second encoder state of the trellis butterfly concurrent with the first state; said first transition metric value associated with the forward transition of the encoder from the second encoder state to a second adjacent encoder state of the butterfly concurrent with the first adjacent encoder state; and, the backward path metric value associated with the second adjacent encoder state to provide a second sum;

(iii) comparing the first sum and the second sum and selecting the maximum value of the two to be a first maximum value;

(iv) adding to the forward path metric value associated with the second encoder state; a second transition metric value associated with the forward transition of the encoder from the second encoder state to the first adjacent encoder state; and, the backward path metric value associated with the first adjacent encoder state to provide a third sum;

(v) substantially simultaneously with step (iv) adding to the forward path metric value associated with the first encoder state; the second transition metric value associated with the forward transition of the encoder from the first encoder state to the second adjacent encoder state; and, the backward path metric value associated with the second adjacent encoder state to provide a fourth sum;

(vi) comparing said third sum and said fourth sum and selecting the maximum value of the two to be a second maximum value.

The sequence of steps (i), (ii) and (iii) is performed substantially simultaneously with the sequence of steps (iv), (v) and (vi) respectively and steps (i) to (vi) are repeated for the encoder states of all of the other three concurrent trellis butterflies to provide a set of first maximum values and a set of second maximum values. In the present example, the set of first maximum values comprises the four elements {llr1_s1_1, llr1_s1_2, llr1_s1_3, llr1_s1_4}, and the set of second maximum values comprises the four elements {llr0_s1_1, llr0_s1_2, llr0_s1_3, llr0_s1_4}.

To determine the LLR value for the trellis segment, the maximum element of the set of second maximum values is subtracted from the maximum element of the set of first maximum values to provide a Log-Likelihood Ratio according to stages 2 and 3 defined above. These two stages define an accelerated LLR operation (LLR_ACC) as explained below.

It will be appreciated that the "Add" component of the LM_ACS operation is here extended from being the addition of two quantities (e.g. path metric+transition metric to the same one state) to the addition of three quantities (i.e. forward path metric+transition metric to different states+backward path metric). Accordingly, this extended LM_ACS operation requires two forward path metric values, two transition metric values and two backward path metric values to process a trellis butterfly.

Figure 8:
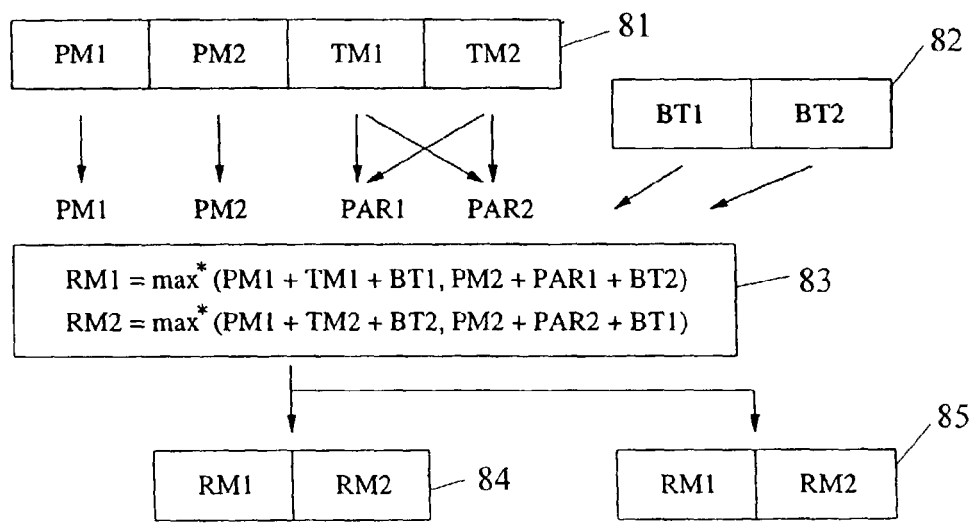
FIG. 8 illustrates a flow diagram of outlining the extended operation of the accelerated Log-MAP decoding algorithm (LM_ACS)

The extended LM_ACS operation is schematically illustrated in FIG. 8. This extended LM_ACS operation requires the same four metric values 81 (i.e. PM1,PM2,TM1,TM2) required of the LM_ACS operation when used in path metric updating, plus an additional two parameters 82 (i.e. BT1 and BT2), which represent the backward path metric values associated with two concurrent butterfly states. In addition, the parameters PAR1 and PAR2 generalise the two transition metric values TM1 and TM2 in that each one of the two parameters may take any one of the values TM1 and TM2, depending upon the function of the LM_ACS operation.

When used to perform simple metric updating, the LM_ACS operation requires the DSP to call metrics 81 from the DSP memory store, metrics 82 are not called from the aforementioned cache and their value is set to BT1=0 and BT2=0 by the DSP. Similarly, the DSP sets PAR1=TM2 and PAR2=TM1 and performs the LM_ACS operations 83 resulting two updated path metrics RM1 And RM2. These two path metrics 84 are returned to the DSP memory store for later use in LLR calculation using the extended LM_ACS operation.

When used to perform stage 1 above, the extended LM_ACS operation requires the DSP to call metrics 81 and 82 from the DSP memory store. The DSP sets PAR1=TM1 and PAR2=TM2 and performs the LM_ACS operations 83 resulting two elements, RM1 And RM2, of the sets of first and second maximum values respectively. These two elements 84 are returned to the DSP memory store. This process is repeated until all required butterflies are processed and the sets of first and second maximum values are complete. Stages 2 and 3 above may then be performed in respect of these two sets.

To accelerate the calculation of stages 2 and 3 of the LLR calculation, the operation LLR_ACC is introduced. In performing this operation, the DSP obtains all of its data from the cache within which are stored the elements of the first and second sets of maximum values.

The DSP calculates the LLR value by subtracting the maximum element of the set of second maximum values from the maximum element of said set of first maximum values according to the LLR_ACC operation having the steps of:

(i) choosing two elements from the set of first maximum values, comparing the two elements and selecting the maximum value of the two to be an element in a successive set of first maximum values;

(ii) substantially simultaneously with step (i) choosing two elements from the set of second maximum values, comparing the two elements and selecting the maximum value of the two to be an element in a successive set of second maximum values;

(iii) repeating steps (i) and (ii) in respect of all previously un-chosen elements of the sets of first and second maximum values until all elements of each have been so selected;

(iv) repeating steps (i) to (iii) in respect of each successive set of first and second maximum values until each the successive set ultimately comprises only one element;

(v) subtracting the value of the one element of the ultimate successive set of first maximum values from that of the one element of the ultimate successive set of second maximum values so as to provide a Log-Likelihood Ratio.

In this way the calculation of the Log-Likelihood Ratio (LLR) for a given encoder transition (time step within the encoder trellis) is accelerated, by performing in parallel the processing of date produced by the extended LM_ACS operation, thus providing an accelerated LLR (LLR_ACC) operation.

Figure 9:
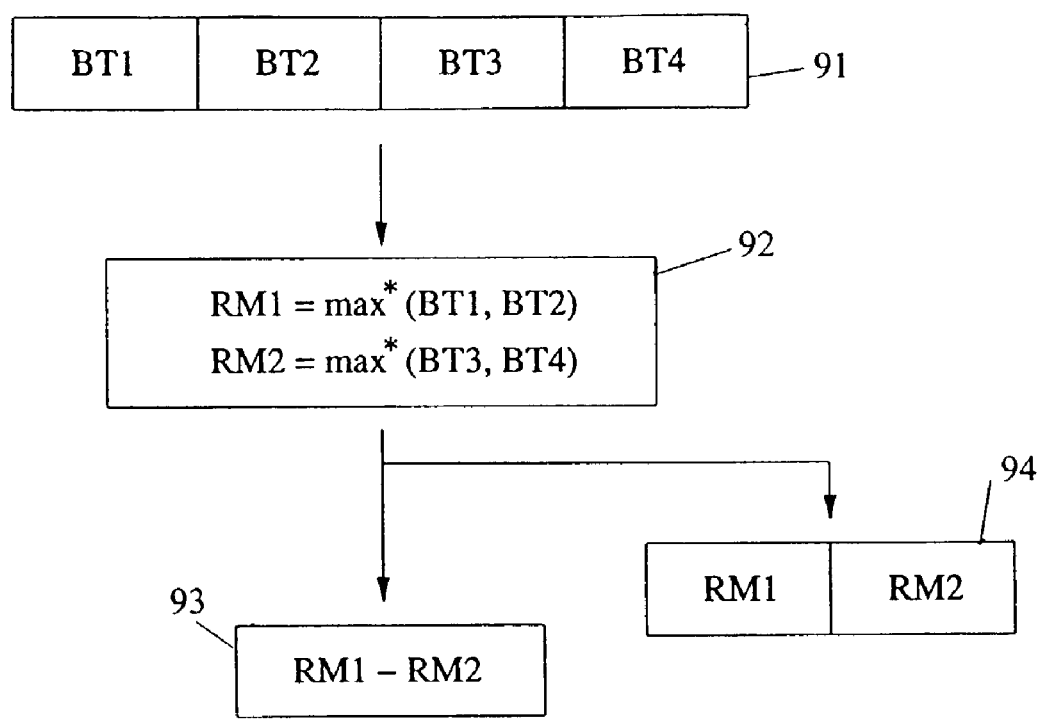
FIG. 9 illustrates a flow diagram outlining the operation of the accelerated Log-Likelihood Ratio (LLR_ACC) calculation.

The LLR_ACC operation is schematically illustrated in FIG. 9. This operation requires the DSP to retrieve four elements 91 (i.e. BT1,BT2,BT3,BT4) from the cache store into which they were copied during the extended LM_ACS operation of the DSP (denoted RM1, RM2 etc at 85 of FIG. 8). The DSP then performs the LLR_ACC operation 92 simultaneously upon two pairs of the four input elements and outputs the two results 94, RM1 and RM2, to the same cache from whence they came overwriting two of the previously retrieved elements in that cache. These two cached values represent elements of a successive set of first maximum and second maximum elements respectively. Also, the DSP calculates the difference value RM1-RM2 and stores the value in the main DSP memory store. This process is repeated until all elements of the sets of first and second maximum values have been processed, and the successive sets of first maximum values and second maximum values are complete (i.e. stage 2 is complete in this example).

Except for the last stage of the LLR_ACC operation (here stage 3) the difference value RM1-RM2 is meaningless. At the last stage, the difference value is the LLR.

Figure 10:
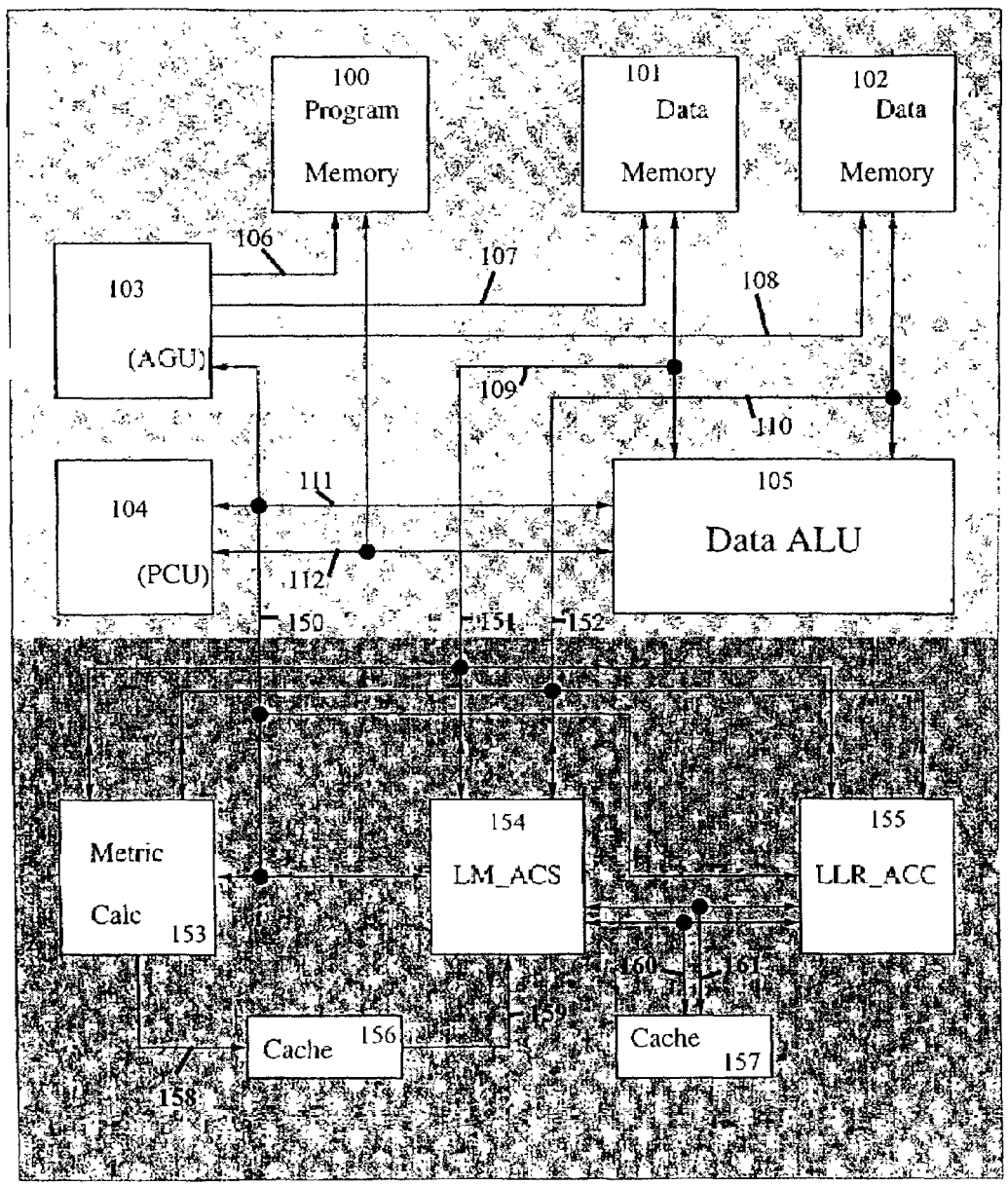
FIG. 10 illustrates a block diagram of an extended digital signal processor core.

FIG. 10 illustrates an example of a DSP core extended to provide the metric calculation, LM_ACS, extended LM_ACS and LLR_ACC operations described above. The DSP includes conventional components such as an address generation unit (AGU) 103 having an address bus 106 connected to a program memory 100, an address bus 107 connected to a first data memory 100, and an address bus 108 connected to a second data memory 102. Data busses 109 and 110 connected the two data memories 101 and 102 to the data ALU 105 of the DSP. A control bus 111 connects the program control unit (PCU) 104 of the DSP to the AGU 103 and to the data arithmetic logic unit (ALU) 105. A program memory data bus 112 connects the program memory 100 to both the data ALU 105 and the PCU 104 of the DSP.

These components and connections of the DSP are generic and their function and interaction shall not be further discussed herein.

An extension to the generic portion of the DSP of FIG. 10 is provided by the metric calculation unit 153, the LM_ACS unit 154, the LLR_ACC unit 155, the transition metric cache 156, and the dual port cache 157 of the DSP. The metric calculating unit 153, the LM_ACS unit 154 and the LLR_ACC unit 155 are connected to the generic portion of the DSP via a control bus 150 which is connected to the control bus 111 of the generic DSP, and consequently to those other DSP components connected to that control bus. Each of the metric calculating unit 153, the LM_ACS unit 154 and the LLR_ACC unit 155 has two data interfaces each connected to a respective one of the two data memories 101 and 102 of the DSP via data busses 151 and 152.

The metric calculating unit 153 is able to calculate transition metric values in accordance with the above described methods, and to supply transition metric values for storage in the data memories 101, 102 of the DSP and in the metric cache 156 thereof. The LM_ACS unit 154 is able to the LM_ACS operation in updating path metric values. Transition metric values, path metric values (forward and backward), and other data values are retrievable by the LM_ACS unit 154 from data memories 101 and 102 and cache 156, for this purpose.

Figure 11:
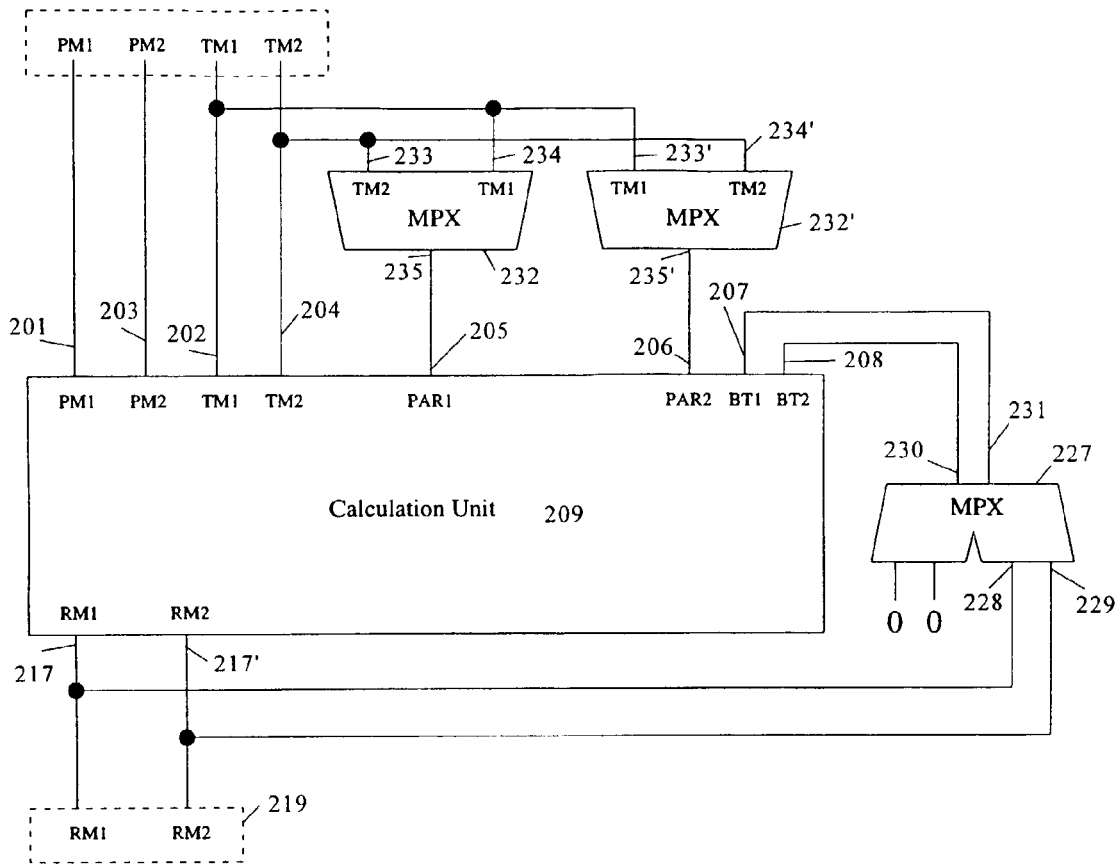
FIG. 11 illustrates a sample architecture for the LM_ACS unit of the extended digital signal processor.

Input lines 201 and 203 of FIG. 11 can each be independently mapped to data busses 151 and 152 of FIG. 10. Input lines 202 and 204 can each be independently mapped to data busses 151, 152 or 159. The return value line 217 is mapped to both data busses 151 and 160 while line 217' is mapped to both data busses 152 and 161. Updated path metric values are returned to the DSP data memories 101 and 102 from the LM_ACS unit 154.

The accelerated LLR operation is performed by the LLR_ACC unit 155. This unit retrieved data values from the dual port cache 157 via dual data busses 160 and 161, and also returns data values thereto. Data values calculated by the LLR_ACC unit are also output to the data memories 101 and 102 of the DSP. These data values include the sets of first and second maximum values, and LLR values.

FIG. 11 illustrates an example of the architecture of the LM_ACS unit 154 suitable for performing the extended LM_ACS operation.

The LM_ACS unit of the DSP comprises a calculation unit 209. The calculation unit is operable to add path metric values to transition metric data values concurrently received at its data input ports to give updated path metric values, compare pairs of concurrent updated path metrics, and concurrently output at separate ones of each data output port 217 and 217' the maximum of the two compared updated path metric pairs in accordance with the "max*" component of the LM_ACS operation described above.

The calculation unit has a first data input port 201 for receiving path metric data values PM1, a second data input port 202 for receiving transition metric data values (TM1), a third data input port 203 for receiving path metric data values (PM2), a fourth data input port 204 for receiving transition metric data values (TM2), a fifth input port 205 for receiving transition metric values (PAR1), a sixth input port 206 for receiving transition metric values (PAR2), a first feedback data input port 207 for receiving backward path metric values (BT1), and a second feedback data input port 208 for receiving backward path metric values (BT2).

The calculation unit is operable to perform the LM_ACS operation illustrated in FIG. 6, and the extended LM_ACS operation illustrated in FIG. 8 depending upon its selected function. The LM_ACS unit has a function selection apparatus comprising transition metric selector gates 232 and 232', and path metric selector gate 227.

The transition metric selector gate 232 (232') has a first input 233 (233') and a second data input 234 (234') for concurrently receiving transition metric values TM2 and TM1, and a data output 235 (235') for outputting one of those two values as the parameter PAR1 (PAR2) to the fifth data input 205 of the calculation unit. The path metric selector gate 227 has two data input ports 228 and 229, connected to respective output ports 217 (217') of the calculation unit 209 for receiving backward path metric values output therefrom. The first data output port 230 of the path metric selector gate 227 is connected to the second feedback data input port 208 of the calculation unit 209. Similarly, the second data output port 231 of the path metric selector gate 227 is connected to the first feedback data input port 207 of the calculation unit.

Thus, data values BT1 and BT2 may be input to the calculation unit via the second and first feedback data output ports 231 and 230, respectively, of the path metric selector gate 227. The path metric selector gate may also set the values BT1 and BT2 to zero.

In its first selection state, the function section apparatus causes the LM_ACS unit to perform path metric updates by having the path metric selector gate 227 set BT1=0 and BT2=0, while simultaneously having transition metric selector gates 232 and 232' set PAR1=TM2 and PAR2=TM1 respectively. Updated transition metric values RM1 and RM2 output from the calculation unit 209 are stored in the main memory store 219 of the DSP and, for backward path metric values, are also copied back into a dual port cache store (not shown).

In its second selection state, the function selection apparatus causes the LM_ACS unit to perform the extended LM_ACS operation as part of an LLR calculation (see stage 1 above). This is achieved by having the path metric selector gate 227 input the values BT1 and BT2, from the output ports 217 (217') of the calculation unit, into the first and second feedback input ports of the calculation unit without setting them to zero. Simultaneously transition metric selector units 232 and 232' set PAR1=TM1 and PAR2=TM2 respectively. Data elements RM1 and RM2 output from the calculating unit 209 are stored in the main memory store 219 of the DSP and, for later use in LLR_ACC operations, are also copied back into the dual port cache store (not shown).

Figure 12:
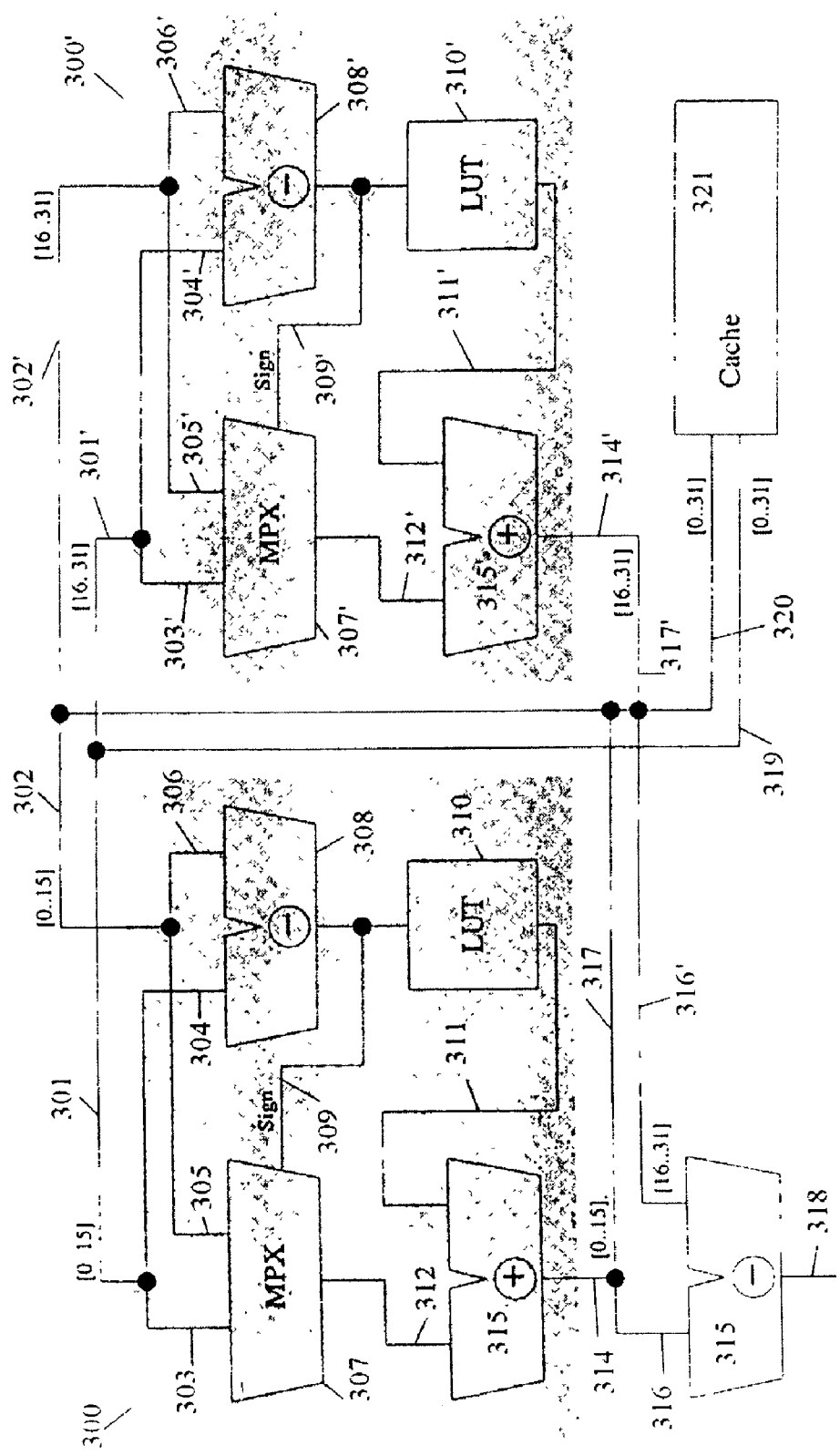
FIG. 12 illustrates a sample architecture for the LLR_ACC unit of the extended digital signal processor.

A sample architecture for the LLR_ACC unit (115 of FIG. 10) is illustrated in FIG. 12. This unit is suitable to perform "stage 2" and "stage 3" discussed above. The LLR_ACC unit comprises a first compare-and-select unit 300 and a second identical compare-and-select unit 300'. Like reference numerals indicate like parts in the two units 300 and 300' (with primes being added to the reference numerals of the latter).

The compare-and-select unit 300 of the LLR_ACC unit comprises a first data input port 301 for receiving via data interface 319, data elements from one of the sets of first and second maximum values stored within the dual port cache 321 (cache data addresses [0 . . . 15]), and a second data input port 302 for concurrently receiving via data interface 320, data elements from the other of the sets of first and second maximum values stored within the dual port cache 321 (cache data addresses [16 . . . 31]).

It is to be noted that the cache 321 of FIG. 12 is the same cache as the cache 157 illustrated in FIG. 10. Consequently, lines 319 and 320 of FIG. 12 also correspond with lines 160 and 161 of FIG. 10.

Furthermore, output line 318 maps to either one of data busses 151 or 152 of FIG. 10.

Data values concurrently received at these two input ports are simultaneously input to a compare unit 307 via the two data input ports 303 and 305 thereof, and input to the difference unit 308 via its two data input ports 304 and 306. The difference unit 308 determines the absolute value of the arithmetic difference (i.e. |b−a|) between the data values concurrently input at its two data input ports (i.e. value "b" at port 304 and value "a" at port 306), and also determines the sign of this difference. The absolute value of this difference is output to a look-up table (LUT) 310 while the sign of this difference is output to a third data input 309 of the compare unit 307.

On the basis of the sign value input to at port 309, the compare unit 307 selects the maximum of the two data values concurrently input to it at data input ports 303 and 305, and outputs the selected maximum data value on output port 312 to an adder unit 315. Simultaneously with this operation, a correction term is retrieved from the look-up table 310, on the basis of the data input to it from difference unit 308, and is output via output port 311 to adder unit 315. The adder unit then adds the correction value to the selected maximum value and outputs the result at the output port 314 of the compare-and-select unit 300.

The above explanation applies to the parallel compare-and-select unit 300' with like items given like (primed) reference numerals.

Thus, the compare-and-select units 300 (300') perform the max* operation as defined by:

$$\max{}^*(a,b) = \max(a,b) + \ln(1 + \exp(-|a-b|)).$$

The correction term ln(1+exp(−|a−b|)) being added to the result of the result of the ACS operation associated with the "max" operation to provide the full Jacobian logarithm of which the "max" operator is only an approximation. This is implemented in the digital signal processor of the present embodiment by use of the look-up table (LUT) 310 (310') as explained above.

Thus, the compare-and-select unit 300 (300') performs the "max*" operation upon the concurrently input data elements and outputs the result at output port 314 (314') to an input port 316 (316') of a subtracting unit 315 and to the dual port cache 321 (via data bus 317 (317')) for use in later stages of the LLR_ACC operation (e.g. "stage 3" above).

The subtracting unit 315 subtracts data values input at port 316' from data values concurrently input at port 316 and outputs the result 318. After the final stage of the LLR_ACC operation has been performed, the output result 318 of the subtracting unit 315 is the LLR value.

It is to be understood that variations and modifications to the above described embodiments of the present invention, as would be readily apparent to the skilled person, may be made without departing from the scope of the present invention.

The invention claimed is:

1. A method for calculating path metric values of a convolutional encoder for use in decoding according to a Log-MAP algorithm a bit sequence encoded thereby and received through a noisy channel, the method comprising th steps of:

(i) adding to a path metric value associated with a first encoder state a first transition metric value asociated with a transition of said encoder from said first encoder state to a first adjacent encoder state thereby providing a first path metric value for said first adjacent encoder state;

(ii) substantially simultaneously with step (i) adding to a path metric value associated with a second encoder state concurrent with said first encoder state a second transition metric value associated with a transition of said encoder from said second encoder state to said first adjacent encoder state thereby providing a second path metric value for said first adjacent encoder state;

(iii) comparing said first path metric value for said first adjacent encoder state to said second path metric value for said first adjacent encoder state and selecting a maximum of the first path metric value for said first adjacent encoder state to said second path metric value for said first adjacent encoder state to be the path metric value associated with said first adjacent encoder state;

(iv) adding to the path metric value associated with said first encoder state said second transition metric value associated with a transition of said encoder from said first encoder state to a second adjacent encoder state concurrent with said first adjacent encoder state thereby providing a first path metric value for said second adjacent encoder state;

(v) substantially simultaneously with step (iv) adding to the path metric value associated with said second encoder state said second transition metric value associated with a transition of said encoder from said second encoder state to said second adjacent encoder state thereby providing a second path metric value for said second adjacent encoder state;

(vi) comparing said first path metric value for said second adjacent encoder state to said second path metric value for said second adjacent encoder state and selecting a maximum of the said first path metric value for said second adjacent encoder state and said second path metric value for said second adjacent encoder state to be the path metric value associated with said second adjacent encoder state;

wherein said encoder states and said adjacent encoder states define a trellis butterfly and the sequence of steps (i), (ii) and (iii) are performed substantially simultaneously with the sequence of steps (iv), (v) and (vi) respectively.

2. A method according to claim 1 wherein a correction term:

$$\ln(1+\exp(-\Delta))$$

is added to the path metric value associated with a given adjacent encoder state, where $\Delta$ is the absolute value of the difference between said first path metric value of said given adjacent encoder state and said second path metric value thereof.

3. A method according to claim 1 wherein steps (i) to (vi) are repeated for all other concurrent trellis butterflies.

4. A method according to claim 3 wherein the path metric values for all of said encoder states and said adjacent encoder states are forward path metrics calculated by forward recursion wherein all of said adjacent encoder states succeed all of said encoder states.

5. A method according to claim 3 wherein the path metric values for all of said encoder states and said adjacent encoder states are backward path metrics calculated by backward recursion wherein all of said adjacent encoder states precede all of said encoder states.

6. A digital signal processor for calculating path metric values of a convolutional encoder for use in decoding, according to claim 1, an encoded bit sequence received thereby through a noisy channel, the processor comprising:
a transition metric calculating unit for receiving from a memory store of the digital signal processor data concerning said bit sequence, for calculating transition metric values representing transitions between states of a convultuional encoder, and for outputting those calculated metric values;
an Add-Compare-Select (ACS) unit for receiving said calculated transition metric values, for receiving path metric values derived from said calculated transition metric values, for deriving updated path metric values from said path metric values and said transition metric values, and for outputting these updated path metric values.

7. A digital signal processor according to claim 6 having a transition metric cache into which the metric calculating unit is operable to output and store calculated transition metric values, and the ACS unit is operable to receive those transition metric values from the transition metric cache.

8. A digital signal processor according to claim 6 wherein the ACS unit comprises:
a calculation unit having a number of data input ports, two data output ports;
wherein the calculation unit is operable to add path metric values to transition metric data values concurrently received at the data input ports thereof to provide two concurrent pairs of updated path metric values, to compare within each concurrent pair said updated metric values and to output at said two data output ports thereof the maximum path metric value of each concurrent pair.

9. A digital signal processor according to claim 8 wherein, the calculation unit has a first data input port for receiving path metric data values, a second data input port for receiving transition metric data values, a third data input port for receiving path metric data values, and a fourth data input port for receiving transition metric data values.

10. A digital signal processor according to claim 6 having an additional cache apparatus within which the ACS unit is operable to retrievably store data values calculated thereby.

11. A digital signal processor according to claim 6 wherein, the ACS uit has function-selection apparatus which is operable to select the function of the ACS to be that of producing updated path metrics, or to be that of producing the elements of the first and second sets of maximum values for use in calculating Log-Likelihood Ration (LLR) values.

12. A digital signal processor according to claim 11 wherein, the function-selection apparatus comprises:
a first data input gate connected in-between the two data output ports of the calculation unit and two feedback data input ports of the calculation unit of the ACS unit;
a second data input gate connected to the second and fourth data input ports of the calculation unit and to a fifth data input port thereof;
a third data input gate connected to the second and fourth data input ports of the calculation unit and to a sixth data input port thereof;
wherein the function-selection apparatus is operable to select the data values to be input to the feedback data input ports, and the fifth and sixth data input ports of the calculation unit.

13. A digital signal processor according to claim 12 wherein, in a first selection state of the function selection apparatus, the first data input gate blocks data output from the calculation unit and causes data input at the two feedback data input ports thereof to have a value of zero, while concurrently the second data input gate causes transition metric data input at the fourth input port of the calculating unit to be simultaneously input at the fifth data input thereoe, and concurrently the third data input date causes transition metric data input at the second input port of the calculation unit to be simultaneously input at the sixth data input port thereof.

14. A digital signal processor according to claim 12 wherein, in a second selection state of the function selection apparatus, the first data input gate permits data to pass from the outputs of the calculation unit to the two feedback data input ports thereof, while concurrently the second data input gate causes transition metric data input at the second input port of the calculation unit to be simultaneously input at the fifth data input thereof, and concurrently the third data input gate causes transition metric data input at the fourth input port of the calculation unit to be simultaneously input at the sixth data input port thereof.

15. A digital signal processor according to claim 6 further comprising a Log-Likelihood Ratio unit for calculating LLR values, and for outputting calculated LLR values to the memory store of the DSP.

16. A digital signal processor according to claim 15 wherein, the Log-Likelihood Ratio unit is connected to cache apparatus and is operable to retrieve data elements of the sets of first maximum values and second maximum values when stored therein, and is operable to store therein elements of successive sets of first and second maximum values produced by the Log-Likelihood Ratio unit.

17. A digital signal processor according to claim 16 wherein, the Log-Likehood Ratio unit comprises:
cache apparatus operable to store said set of first maximum values, said set of second maximum values and said successive sets thereof;
two compare-and-select units, each one possessing a first data input connected to a data output of said cache apparatus, a second data input port connected to a data output port of said cache apparatus, and a data output port connected to a data input port of said cache apparatus;
wherein one of said compare-and-select units is operable to receive at its first and second data input ports elements of said set of first maximum values output form said cache apparatus, and the other of said compare-and-select units is operable to receive at its first and second data input ports elements of said set of second maximum values output from said cache apparatus, each said compare-and-select unit being operable to compare concurrent first and second inputs and to output via said output ort the element which is the maximum of the two.

18. A digital signal processor according to claim 17 wherein, each compare-and-select unit includes a selecting unit having a first and second input port respectively connected to said first and second input ports of the compare-and-select unit, wherein the selecting unit is operable to receive as a further input the sign output from said subtracting unit and to output the data input via one of its first and second input ports in dependence upon the value of said sign.

19. A digital signal processor according to claim 17 wherein each compare-and-select unit includes correcting apparatus for adding to the output of said selecting unit a correction factor substantially equal to $$\ln(1+\exp(-\Delta))$$

where $\Delta$ is the absolute value of the result output from said subtracting unit.

20. A digital signal processor according to claim 17 wherein, each compare-and-select unit of the Log-Likelihood Ratio unit includes a subtraction unit connected to said first and second input ports of the two compare-and-select means, wherein the subtraction unit is operable to subtract data input at said first input port from data concurrently input at said second input port and to output the signal and the absolute magnitude of the result.

21. A digital signal processor according to claim 17 wherein, said correcting apparatus comprises:
   a look-up table possessing a plurality of correction values and having an input port connected to the output port of said subtracting unit and an output port; and,
   an adder means having a first port connected to said output port of the look-up table and having a second input port connected to the output port of said selecting unit;
   wherein said adder means is operable to add to the output of said selecting unit a correction term output from said look-up-table.

22. A digital signal processor according to claim 17 wherein, in the Log-Likelihood Ratio unit, data elements output from said compare-and-select units are input into said cache apparatus for storage as an element in the respective successive act of maximum values.

23. A digital signal processor according to claim 22 wherein, data elements output port of each of the two compare-and-select units are connected to a respective one of a first input port and a second input port of a subtraction unit which is operable to subtract the data at one input port thereof from the data at the other input port thereof, and to output the result.

24. A method for calculating Log-Likelihood Ratio values for state transitions of a convolutional encoder for use in decoding according to a Log-MAP algorithm a bit sequence encoded thereby and received through a noisy channel, the method comprising the steps (i) to (iii) which are performed in respect of only those transitions corresponding with a parity bit of a first value, and steps (iv) to (vi) which are performed in respect of only those transitions corresponding with a parity bit of a second value:
   (i) adding to a forward path metric value associated with a first encoder state of a given trellis butterfly a first transition metric value associated with a forward transition of said encoder from said first encoder state to a first adjacent encoder state of said butterfly; and, the backward path metric value associated with said first adjacent encoder state to provide a first sum;
   (ii) substantially simultaneously with step (i) adding to the forward path metric value associated with a second encoder state of said trellis butterfly concurrent with said first encoder state, said first transition metric value associated with a forward transition of said encoder from said second encoder state to a second adjacent encoder state of said trellis butterfly concurrent with said first adjacent encoder state; and, the backward path metric value associated with said second adjacent encoder state to provide a second sum;
   (iii) comparing said first sum and said second sum and selecting a maximum value of the said first sum and said second sum to be a first maximum value;
   (iv) adding to the forward path metric value associated with said second encoder state; a second transition metric value associated with a forward transition of said encoder from said second encoder state to said first adjacent encoder state; and, the backward path metric value associated with said first adjacent encoder state to provide a third sum;
   (v) substantially simultaneously with step (iv) adding to the forward path metric value associated with said first encoder state; said second transition metric value associated with a forward transition of said encoder from said first encoder state to said second adjacent encoder state; and, the backward path metric value associated with said second adjacent encoder state to provide a fourth sum;
   (vi) comparing said third sum and said fourth sum and selecting a maximum value of the said thirds sum and said fourth sum to be a second maximum value;
   the sequences of steps (i), (ii) and (iii) being performed substantially simultaneously with the sequence of steps (iv), (v) and (vi) respectively and steps (i) to (vi) being repeated for the encoder states of all other concurrent trellis butterflies to provide a set of first maximum values and a set of second maximum values, wherein a maximum element of said set of second maximum values is subtracted from a maximum element of said set of the first maximum values to provide a Log-Likelihood ratio.

25. A method for calculating Log-Likelihood Ratio values according to claim 24 wherein the maximum element of said set of second maximum values is subtracted from the maximum element of said set of first maximum values according to the steps of:
   (i) choosing two elements from said set of first maximum values, comparing said two elements and selecting a maximum value of the said two elements to be an element in a successive set of first maximum values;
   (ii) substantially simultaneously with step (i) choosing two elements from said set of second maximum values, comparing said two elements and selecting a maximum value of the said two elements to be an element in a successive set of second maximum values;
   (iii) repeating steps (i) and (ii) in respect of all previously unchosen elements of said sets of first and second maximum values until all elements of each have been so selected;
   (iv) repeating steps (i) to (iii) in respect of each successive set of first and second maximum values until each said successive set ultimately comprises only one element;
   (v) subtracting the value of the one element of said ultimate successive set of said first maximum values from that of the one element of said ultimate successive set of said second maximum values so as to provide a Log-Likelihood Ratio.

26. A method according to claim 25 wherein a correction term:

$$\ln(1+\exp(-\Delta))$$

is added to any quantity selected as being the maximum of two quantities compared for that purpose, where $\Delta$ is the absolute value of the difference between said quantities compared.

27. Apparatus for calculating Log-Likelihood Ratios according to the method of claim 25, the apparatus comprising:

cache means operable to store said set of first maximum value, said set of second maximum values and said successive sets thereof;

two compare-and-select means each one possessing a first data input port connected to a data output port of said cache means, a second data input port connected to a data output port of said cache means, and a data output port connected to a data input port of said cache means; wherein one of said compare-and-select means is operable to receive at its first and second data input ports elements of said set of first maximum values output form said cache means, and the other of said compare-and-select means is operable to receive at its first and second data input ports elements of said set of second maximum values output from said cache means, each said compare-and-select means being operable to compare concurrent first and second input and to output via said output port the element which is the maximum of the two.

28. Apparatus for calculating Log-Likelihood Ratios according to claim 27 wherein the element output from either compare-and-select means is input into said cache means for storage as an element in the respective successive set of maximum values.

29. Apparatus for calculating Log-Likelihood Ratios according to claim 28 wherein the output port of each compare-and-select means is connected to one of a first input port and a second input port of a subtracting means wherein the subtracting means is operable to subtract one input from the other input and to output the result.

30. Apparatus for calculating Log-Likelihood Ratios according to claim 27 wherein the element output from either compare-and-select means is input into said cache means for storage as an element in the respective successive set of maximum value overwriting a previously chosen element therein.

31. Apparatus for calculating Log-Likelihood Ratios according to claim 27 wherein each compare-and-select means connected to said first and second input ports of the compare-and-select means, wherein the subtracting is operable to subtract data input at said first input port from data concurrently input at said second input port and to output the sign and the absolute magnitude of the result.

32. Apparatus for calculating Log-Likelihood Ratios according to claim 31 wherein each compare-and-select means includes selecting means having a first and second input ports respectively connected to said first and second input ports of the compare-and-select means, wherein the selecting means is operable receive as a further input the sign output from said subtracting means and to output the data input via one of its first and second input ports in dependence upon the value of said sign.

33. Apparatus for calculating Log-likelihood ratios according to claim 32 wherein each compare-and-select means includes correcting means for adding to the output of said selecting means a correction factor substantially equal to $\ln(1+\exp(-\Delta))$ where $\Delta$ is the absolute value of the result output from said subtracting means.

34. Apparatus for calculating Log-Likelihood Ratios according to claim 33 wherein said correcting means comprises:

a look-up table possessing a plurality of correction values and having an input port connected to the output port of said subtracting means and an output port;

adding means having a first input port connected to said output port of the look-up table and having a second input port connected to the output port of said selecting means;

where the terms s1 and s2 are dependent upon the signal-to-noise ratio associated with the received bit sequence, the received parity and systematic bits corresponding with the bits output from the encoder, and at least an estimate of the a priori probability of the encoder transition.

35. A method for calculating Log-Likelihood Ratios according to claim 24 wherein said forward path metric values are calculated according to a method comprising the steps of:

(i) adding to the path metric value associated with a first encoder state a first transition metric value associated with a transition of said encoder from said first encoder state to a first adjacent encoder state thereby providing a first path metric value for said first adjacent encoder state;

(ii) substantially simultaneously with step (i) adding to the path metric value associated with a second encoder state concurrent with said first encoder state a second transition metric value associated with a transition of said encoder from said second encoder state to said first adjacent encoder state thereby providing a second path metric value for said first adjacent encoder state;

(iii) comparing said first path metric value for said first adjacent encoder state to said second path metric value for said first adjacent encoder state and selecting the maximum of the said first path metric value for said first adjacent encoder state to said second path metric value for said first adjacent encoder state to be the path metric value associated with said first adjacent encoder state;

(iv) adding to the path metric value associated with said first encoder state said second transition metric value associated a transition of said encoder from said first encoder state to a second adjacent encoder state concurrent with said first adjacent encoder state thereby providing a first path metric value for said second adjacent encoder state;

(v) substantially simultaneously with step (iv) adding to the path metric value associated with said second encoder state said second transition metric value associated with the transition of said encoder from said second encoder state to said second adjacent encoder state thereby providing a second path metric value for said second adjacent encoder state;

(vi) comparing said first path metric value for said second adjacent encoder state to said second path metric value for said second adjacent encoder state selecting a maximum of the said first path metric value for said second adjacent encoder state to said second path metric value for said second adjacent encoder state to be the path metric value associated with the second adjacent encoder state;

wherein the path metric values for all of said encoder states and said adjacent encoder states are forward path metrics calculated by forward recursion such that all of said adjacent encoder states succeed all of said encoder states, and the sequence of steps (i), (i) and (iii) are performed substantially simultaneously with the sequence of steps (iv), (v) and (vi) respectively.

36. A method for calculating Log-Likelihood Ratios according to claim 24 wherein said backward path metric values are calculated according to a method comprising the steps of:
  (i) adding to a path metric value associated with a first encoder state a first transition metric value associated with a transition of said encoder from said first encoder state to a first adjacent encoder state thereby providing a firth path metric value for said first adjacent encoder state;
  (ii) substantially simultaneously with step (i) adding to a path metric value associated with a second encoder state concurrent with said first encoder state a second transition metric value associated with a transition of said encoder from said second encoder state to said first adjacent encoder state thereby providing a second path metric value for said first adjacent encoder state;
  (iii) comparing said first path metric value for said first adjacent encoder state to said second path metric value for said first adjacent encoder state and selecting a maximum of the said first path metric value for said fifth adjacent encoder state to said second path metric value for said first adjacent encoder state to be the path metric value associated with said first adjacent encoder state;
  (iv) Adding to the path metric value associated with said first encoder state said second transition metric value associated with a transition of said encoder from said first encoder state to a second adjacent encoder state concurrent with said first adjacent encoder state thereby providing a first path metric value for said second adjacent encoder state;
  (v) substantially simultaneously with step (iv) adding to the path metric value associated with said second encoder state said second transition metric value associated with a transition of said encoder from said second encoder state to said second adjacent encoder state thereby providing a second path metric value for said second adjacent encoder state;
  (vi) comparing said first path metric value for said second encoder state to said second path metric value for said second adjacent encoder and selecting a maximum of the said first path metric value for second adjacent encoder state to said second path metric value for said second adjacent encoder state to be the path metric value associated with said second adjacent encoder state;
  wherein the path metric values for all of said encoder states and said adjacent encoder states are backward path metrics calculated by backward recursion wherein all of said adjacent encoder states precede all of said encoder states, and the sequence of steps (i), (ii) and (iii) are performed substantially simultaneously with the sequence of steps (iv), (v) and (vi) respectively.

37. A method according to claim 24 wherein said first value of parity bits output from said encoder is +1 and said second value thereof is −1.

$$\gamma(-1,+1)=4\times SNR\times y_p$$

$$\gamma(+1,-1)=4\times SNR\times y_2+a,$$

wherein SNR is the signal-to-noise ratio associated with said received bit sequence, $y_p$ and $y_s$ are the received parity and systematic bits respectively corresponding with said bits output from the encoder, and the term z represents at least an estimate of a priori probability of the encoder transition.

38. A method for calculating transition metric values($\gamma$) for use in decoding according to claim 37 wherein: the encoder transition associated with the output therefrom of a systematic and a parity bit of values −1 and −1 respectively is assigned a first transition metric value of $$\gamma(-1,-1)=0;$$

the encoder transition associated with the output therefrom of a systematic and a parity bit of values −1 and +1 respectively is assigned a second transition metric value of $$\gamma(-1,+1)=s1;$$

the encoder transition associated with the output therefrom of a systematic and a parity bit of values +1 and −1 respectively is assigned a third transition metric value $$\gamma(+1,-1)=s2;$$

the encoder transition associated with the output therefrom of a systematic and a parity bit of values +1 and +1 respectively is assigned a transition metric value $\gamma(+1,+1)$ equal to the sum of said first and second transition metric values;
wherein the terms s1 and s2 are dependent on the signal-to-noise ratio associated with the received bit sequence, the received parity and systematic bits corresponding with the bits output from the encoder, and at least an estimate of the a priori probability of the encoder transition.

39. A method for calculating transition metric values($\gamma$) for use in decoding according to claim 38 where $$\gamma(-1,-1)=4\times SNR\times y_s+z,$$

wherein SNR is the signal-to-noise ratio associated with said received bit sequence, $y_p$ and $y_s$ are the received parity and systematic bits respectively corresponding with said bits output from the encoder, and the term z represents at least an estimate of the a priori probability of the encoder transition.

40. A digital signal process for calculating path metric values of a convolutional encoder for use in decoding, according to claim 37, an encoder bit sequence received thereby through a noisy channel, the processor comprising:
  a transition metric calculating unit for receiving from a memory store of the digital signal processor data concerning said encoded bit sequence, for calculating transition metric values representing transitions between states of a convolutional encoder, and for outputting those calculated metric values;
  an Add-Compare-Select (ACS) unit for receiving said calculated transition metric values, for receiving path metric values derived from said calculated transition metric values, for deriving updated path metric values from said path metric values and said transition metric values, and for outputting these updated path metric values wherein the updated path metric values are derived in accordance with a method for calculating path metric values of a convolutional encoder for use in decoding according to a Log-MAP algorithm a bit sequence encoded thereby and received through a noisy channel, the method comprising the steps of:
  (i) adding to a path metric value associated with a first encoder state a first transition metric value associated with a transition of said encoder from said first encoder state to a first adjacent encoder state thereby providing a first path metric value for said first adjacent encoder state;

(ii) substantially simultaneously with step (i) adding to a path metric value associated with a second encoder state concurrent with said first encoder state a second transition metric value associated with a transition of said encoder from said second encoder state to said first adjacent encoder state thereby providing a second path metric value for said first adjacent encoder state;

(iii) comparing said first path metric value for said first adjacent encoder state to said second path metric value for said first adjacent encoder state and selecting a maximum of the said first adjacent encoder state to said second path metric value for said first adjacent encoder state to be the path metric value associated with said first adjacent encoder state;

(iv) adding to the path metric value associated with said first encoder state said second transition metric value associated with a transition of said encoder from said first encoder state to a second adjacent encoder state concurrent with said first adjacent encoder state thereby providing a first path metric value for said second adjacent encoder state;

(v) substantially simultaneously step (iv) adding to the path metric value associated with said second encoder state said second transition metric value associated with a transition of said encoder from said second encoder state to said second adjacent encoder state thereby providing a second path metric value for said second adjacent encoder state;

(vi) comparing said first path metric value for said second adjacent encoder state to said second path metric value for said second adjacent encoder state and selecting a maximum of the said first path metric value for said second adjacent encoder state and said second path metric value for said second adjacent encoder state to be the path metric value associated with said second adjacent encoder state;

wherein said encoder states and said adjacent encoder states define a trellis butterfly and the sequence of steps (i), (ii) and (iii) are performed substantially simultaneously with the sequence of steps (iv), (v) and (vi) respectively;

wherein the transition metric calculating unit employs a method for calculating transition metric values($\gamma$) for use in decoding wherein: the encoder transition associated with the output therefrom of a systematic and a parity bit of values −1 and −1 respectively is assigned a first transition metric value of $\gamma(-1,-1)=0$;

the encoder transition associated with the output therefrom of a systematic and a parity bit of values −1 and +1 respectively is assigned a second transition metric value of $\gamma(-1,+1)=s1$;

the encoder transition associated with the output therefrom of a systematic and a parity bit of values +1 and −1 respectively is assigned a third transition metric value $\gamma(+1,-1)=s2$;

the encoder transition associated with the output therefrom of a systematic and a parity bit of values +1 and +1 respectively is assigned a transition metric value $\gamma(+1,+1)$ equal to the sum of said first and second transition metric values;

wherein the terms s1 and s2 are dependent on the signal-to-noise ratio associated with the received bit sequence, the received parity and systematic bits corresponding with the bits output from the encoder, and at least an estimate of the a priori probability of the encoder transition.

41. A digital signal processor according to claim 40 wherein, the transition metric calculating unit is operable to output calculated transition metric values to a memory store of the digital signal process to which the ACS unit is also connected for the purposes of receiving transition metric values therefrom.

42. A digital signal processor according to claim 41 wherein, the ACS unit is operable to receive path metric values and transition metric values from the memory store of the digital signal processor, and to output updated path metric values thereto for storage in that memory store.

43. A decoder comprising a plurality of Log-MAP decoders wherein, each Log-MAP decoder comprises branch metric calculating apparatus for calculating transition metric values ($\gamma$), according to a method for calculating Log-Likelihood Ratio values for state transitions of a convolutional encoder for use in decoding according to a Log-MAP algorithm a bit sequence encoded thereby and received through a noisy channel, the method comprising the steps (i) to (iii) which are performed in respect of only those transitions corresponding with a parity bit of a first value, and steps (iv) to (vi) which are performed in respect of only those transitions corresponding with a parity bit of a second value:

(i) adding to a forward path metric value associated with a first encoder state of a given trellis butterfly a first transition metric value associated with a forward transition of said encoder from said first encoder state to a first adjacent encoder state of said butterfly; and, the backward path metric value associated with said first adjacent encoder state to provide a first sum;

(ii) substantially simultaneously with step (i) adding to the forward path metric value associated with a second encoder state of said trellis butterfly concurrent with said first encoder state; said first transition metric value associated with a forward transition of said encoder from said second encoder state to a second adjacent encoder state of said trellis butterfly concurrent with said first adjacent encoder state; and, the backward path metric value associated with said second adjacent encoder state to provide a second sum;

(iii) comparing said first sum and said second sum and selecting a maximum value of the said first sum and said second sum to be a first maximum value;

(iv) adding to the forward path metric value associated with said second encoder state; a second transition metric value associated with a forward transition of said encoder form said second encoder state to said first adjacent encoder state; and, the backward path metric value associated with said first adjacent encoder state to provide a third sum;

(v) substantially simultaneously with step (iv) adding to the forward path metric value associated with said first encoder state; said second transition metric value associated with a forward transition of said encoder from said first encoder state to said second adjacent encoder state; and, the backward path metric value associated with said second adjacent encoder state to provide a fourth sum;

(vi) comparing said third sum and said fourth sum and selecting the maximum value of the said third sum and said fourth sum to be a second maximum value;

the sequence of steps (i), (ii) and (iii) being performed substantially simultaneously with the sequence of steps (iv), (v) and (vi) respectively and steps (i) to (vi) being repeated for the encoder states of all other concurrent trellis butterflies to provide a set of first maximum values and a set of second maximum values, wherein a maximum element of said set of second maximum values is subtracted from a maximum element of said set of first maximum values to provide a Log-Likelihood Ratio, wherein said first value of parity bits output from encoder is +1 and said second value thereof is −1

$\gamma(-1,+1)=4\times SNR\times y_p$ and $\gamma(+1,-1)=4\times SNR\times y_s+y,$ wherein SNR is the signal-to-noise ratio associated with said received bit sequence, $y_p$ and $y_s$ are the received parity and systematic bits respectively corresponding with said bits output from the encoder, and the term z represents at least an estimate of the a priori probability of the encoder transition; and wherein the encoder transition associated with the output therefrom of a systematic and a parity bit of values −1 and −1 respectively is assigned a first transition metric value of $\gamma(-1,-1)=0;$ the encoder transition associated with the output therefrom of a systematic and a parity bit of values −1 and +1 respectively is assigned a second transition metric value of $\gamma(-1,+1)=s1;$ the encoder transition associated with the output therefrom of a systematic and a parity bit of values +1 and −1 respectively is assigned a third transition metric value $\gamma(+1,-1)=s2;$ the encoder transition associated with the output therefrom of a systematic and a parity bit of values +1 and +1 respectively is assigned a transition metric value $\gamma(+1,+1)$ equal to the sum of said first and second transition metric values;

where the terms s1 and s2 are dependent on the signal-to-noise ratio associated with the received bit sequence, the received parity and systematic bits corresponding with the bits output from the encoder, and at least an estimate of the a priori probability of the encoder transition.

44. A decoder comprising a plurality of Log-Map decoders wherein each Log-MAP decoder comprises path metric calculating apparatus for calculating path metric values of said encoder according to a method for calculating path metric values of a convolutional encoder for use in decoding according to a Log-MAP algorithm a bit sequence encoded thereby and received through a noisy channel, the method comprising the steps of:

(i) adding to a path metric value associated with a first encoder state a first transition metric value associated with a transition of said encoder from said first encoder state to a first adjacent encoder state thereby providing a first path metric value for said first adjacent encoder state;

(ii) substantially simultaneously with step (i) adding to a path metric value associated with a second encoder state concurrent with said first encoder state and a second transition metric value associated with a transition of said encoder from said second encoder state to said first adjacent encoder state thereby providing a second path metric value for said first adjacent encoder state;

(iii) comparing said first path metric value for said first adjacent encoder state to said second path metric value for said first adjacent encoder state and selecting a maximum of the first path metric value for said first adjacent encoder state to said second path metric value for said first adjacent encoder state to be the path metric value associated with said first adjacent encoder state;

(iv) adding to the path metric values associated with said first encoder state said second transition metric value associated with a transition of said encoder from said first encoder state to a second adjacent encoder state concurrent with said first adjacent encoder state thereby providing a first path metric value for said second adjacent encoder state;

(v) substantially simultaneously with step (iv) adding to the path metric value associated with said second encoder state said second transition metric value associated with the transition of said encoder from said second encoder state to said second adjacent encoder state thereby providing a second path metric value for said second adjacent encoder state;

(vi) comparing said first path metric value for said second adjacent encoder state to said second path metric value for said second adjacent encoder state and selecting a maximum of the first path metric value for said second adjacent encoder state to said second path metric value for said second adjacent encoder state to be the path metric value associated with said second adjacent encoder state;

wherein said encoder states and said adjacent encoder states define a trellis butterfly and the sequence of steps (i), (ii) and (iii) are performed substantially simultaneously with the sequence of steps (iv), (v) and (vi) respectively.

45. A decoder comprising a plurality of Log-MAP decoders wherein each Log-MAP decoder comprises a Log-Likelihood ratio unit for calculating Log-Likelihood Ratio values of a convolutional encoder according to a method for calculating decoding according to a Log-MAP algorithm a bit sequence encoded thereby and received through a noisy channel, the method comprising the steps (i) to (iii) which are performed in respect of only those transitions corresponding with a parity bit of a first value, and steps (iv) to (vi) which are performed in respect of only those transitions corresponding with a parity bit of a second value:

(i) adding to a forward path metric value associated with a first encoder state of a given trellis butterfly a first transition metric value associated with a forward transition of said encoder from said first encoder state to a first adjacent encoder state of said butterfly; and, the backward path metric value associated with said first adjacent encoder state to provide a first sum;

(ii) substantially simultaneously with step (i) adding to the forward path metric value associated with a second encoder state of said trellis butterfly concurrent with said first encoder state; said first transition metric value associated with a forward transition of said encoder from said second encoder state to a second adjacent encoder state of said trellis butterfly concurrent with said first adjacent encoder state; and, the backward path metric value associated with said second adjacent encoder state to provide a second sum;

(iii) comparing said first sum and said second sum and selecting a maximum value of the said first sum and said second sum to be a first maximum value;

(iv) adding to the forward path metric value associated with said second encoder state; a second transition metric value associated with a forward transition of said encoder from said second encoder state to said first adjacent encoder state; and, the backward path metric value associated with said first adjacent encoder state to provide a third sum;

(v) substantially simultaneously with step (iv) adding to the forward path metric value associated with said first encoder state; said second transition metric value associated with a forward transition of said encoder from said first encoder state to said second adjacent encoder state; and, the backward path metric value associated with said second adjacent encoder state to provide a fourth sum;

(vi) comparing said third sum and said fourth sum and selecting a maximum value of the said third sum and said fourth sum to be a second maximum value;

the sequence of steps (i), (ii) and (iii) being performed substantially simultaneously with the sequence of steps (iv), (v) and (vi) respectively and steps (i) to (vi) being repeated for the encoder states of all other concurrent trellis butterflies to provide a set of first maximum values and a set of second maximum values, wherein a maximum element of said set of second maximum values is subtracted from a maximum element of said set of first maximum values to provide a Log-Likelihood Ratio.

* * * * *